(12) United States Patent
Tsukamoto et al.

(10) Patent No.: US 8,188,455 B2
(45) Date of Patent: May 29, 2012

(54) INFORMATION RECORDING/REPRODUCING DEVICE

(75) Inventors: Takayuki Tsukamoto, Kawasaki (JP);
Kohichi Kubo, Yokohama (JP);
Chikayoshi Kamata, Kawasaki (JP);
Takahiro Hirai, Yokohama (JP); Shinya Aoki, Yokohama (JP); Toshiro Hiraoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 12/636,366

(22) Filed: Dec. 11, 2009

(65) Prior Publication Data

US 2010/0127235 A1 May 27, 2010

Related U.S. Application Data

(63) Continuation of application No. PCT/JP2008/060563, filed on Jun. 9, 2008.

(30) Foreign Application Priority Data

Jun. 12, 2007 (JP) ................. 2007-155678

(51) Int. Cl.
*H01L 45/00* (2006.01)
(52) U.S. Cl. .......... 257/5; 257/3; 257/213; 257/E45.002
(58) Field of Classification Search ....... 257/5, E45.002, 257/3, 4, 213, 215
See application file for complete search history.

(56) References Cited

U.S. PATENT DOCUMENTS

| | | | |
|---|---|---|---|
| 7,006,371 B2 | 2/2006 | Matsuoka | |
| 7,092,278 B2 | 8/2006 | Ishida et al. | |
| 8,089,796 B2 | 1/2012 | Tsukamoto et al. | |
| 2007/0063180 A1 | 3/2007 | Asano et al. | |
| 2007/0133358 A1 | 6/2007 | Kubo et al. | |
| 2010/0127235 A1 | 5/2010 | Tsukamoto et al. | |
| 2010/0316831 A1 | 12/2010 | Kubo et al. | |
| 2011/0031459 A1 | 2/2011 | Kubo et al. | |

FOREIGN PATENT DOCUMENTS

| | | |
|---|---|---|
| JP | 2004-234707 | 8/2004 |
| JP | 2005-252068 | 9/2005 |
| JP | 2005-317787 | 11/2005 |
| JP | 2007-73779 | 3/2007 |
| WO | WO 2005/101420 A1 | 10/2005 |
| WO | 2005/106955 A1 | 11/2005 |

OTHER PUBLICATIONS

"The "Millipede"-Nanotechnology Entering Data Storage"; IEEE Transactions on Nanotechnology, vol. 1, No. 1, Mar. 2002; P. Vettiger et al.; pp. 39-55.
"Thousands of Microcantilevers for Highly Parallel and Ultra-dense Data Storage"; IBM Research, Zurich Research Laboratory, 8803 Rüschlikon, Switzerland; P. Vettiger et al.; pp. 32.1.1-32.1.4.

(Continued)

*Primary Examiner* — Roy Potter
(74) *Attorney, Agent, or Firm* — Oblon, Spivak, McClelland, Maier & Neustadt, L.L.P.

(57) ABSTRACT

An information recording/reproducing device includes a recording layer, and a recording circuit which records data to the recording layer by generating a phase change in the recording layer. The recording layer includes a first chemical compound having a spinel structure. The recording layer is $A_xM_yX_4$ ($0.1 \leq x \leq 2.2$, $1.0 \leq y \leq 2.0$), where A includes one selected from a group of Zn, Cd and Hg, M includes one selected from a group of Ti, Zr, Hf, V, Nb and Ta, and X includes O.

16 Claims, 23 Drawing Sheets

OTHER PUBLICATIONS

"Nano-sized domain inversion characteristics in LiNbO3 group single cystals using SNDM"; Atsushi Onoe et al.; R&D Laboratories Pioneer Corporation, 6-1 1 Fujimi, Tsurugashima, Saitama 350-2288; Materials Science and Engineering B 120 (2005) pp. 130-133.

Japanese Office Action issued on Feb. 15, 2011 in corresponding Japanese Application No. 2007-155678 (with an English Translation).

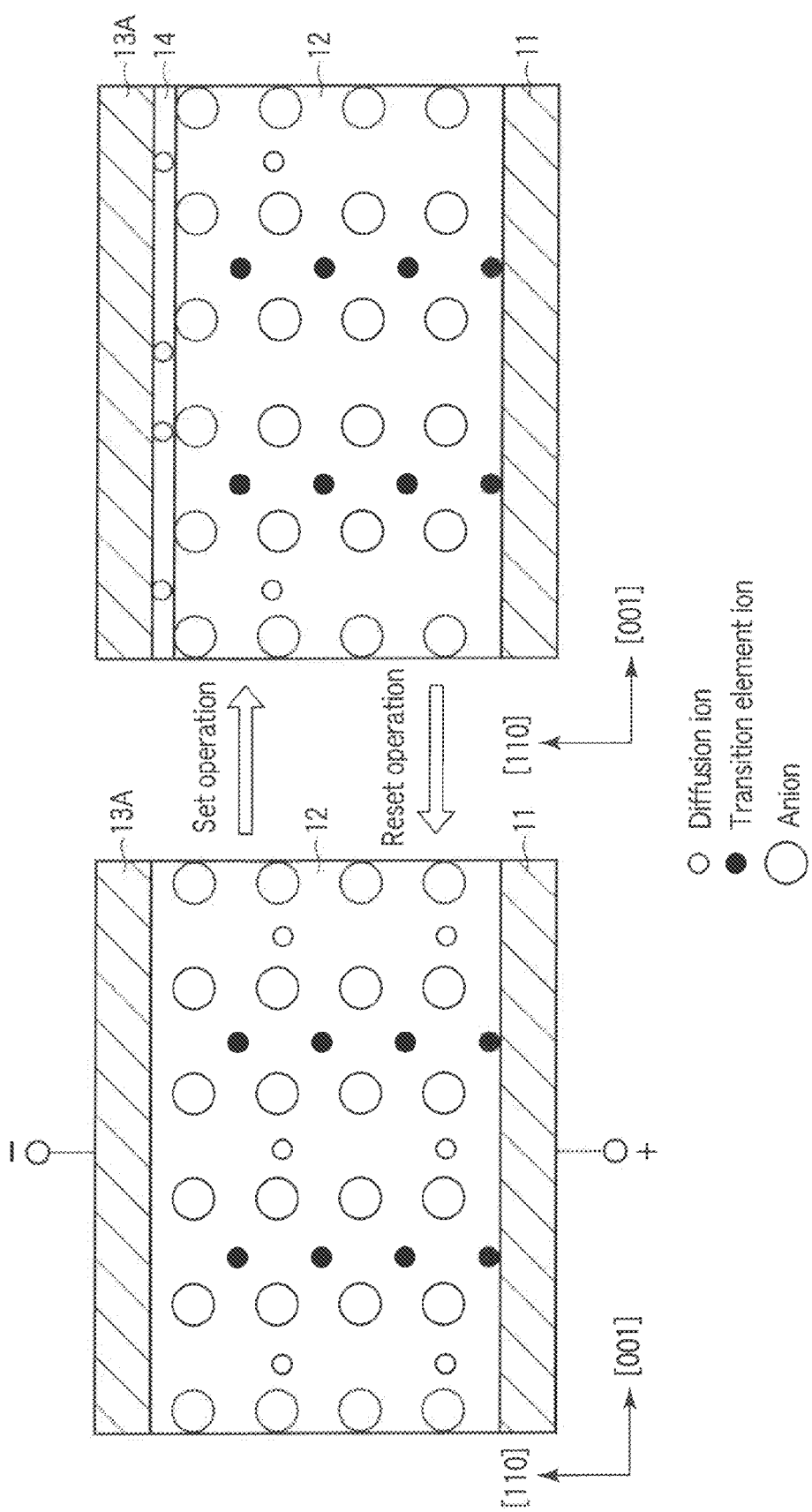
F I G. 1

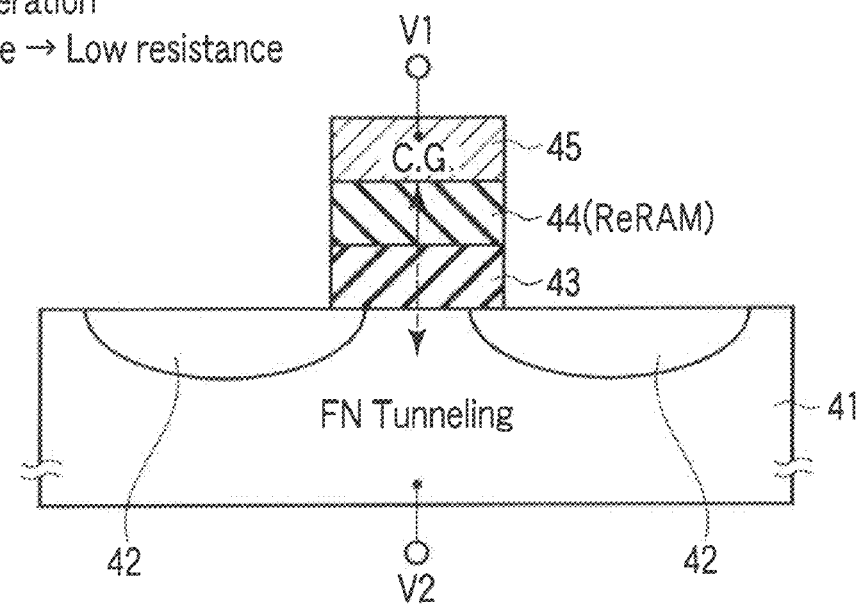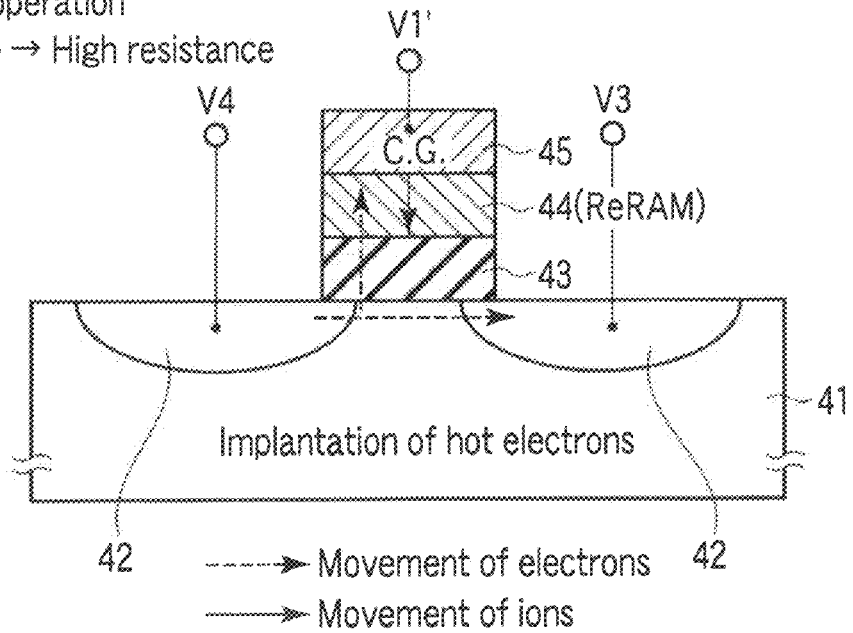
F I G. 16

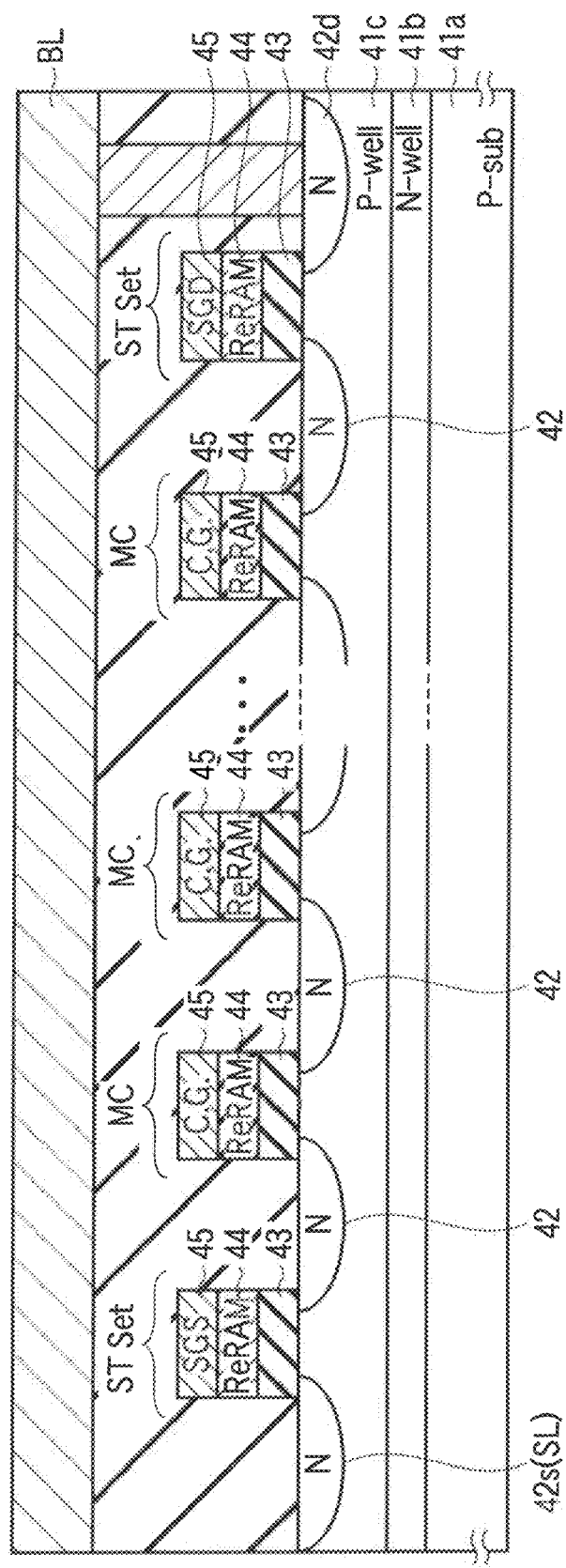
F I G. 18

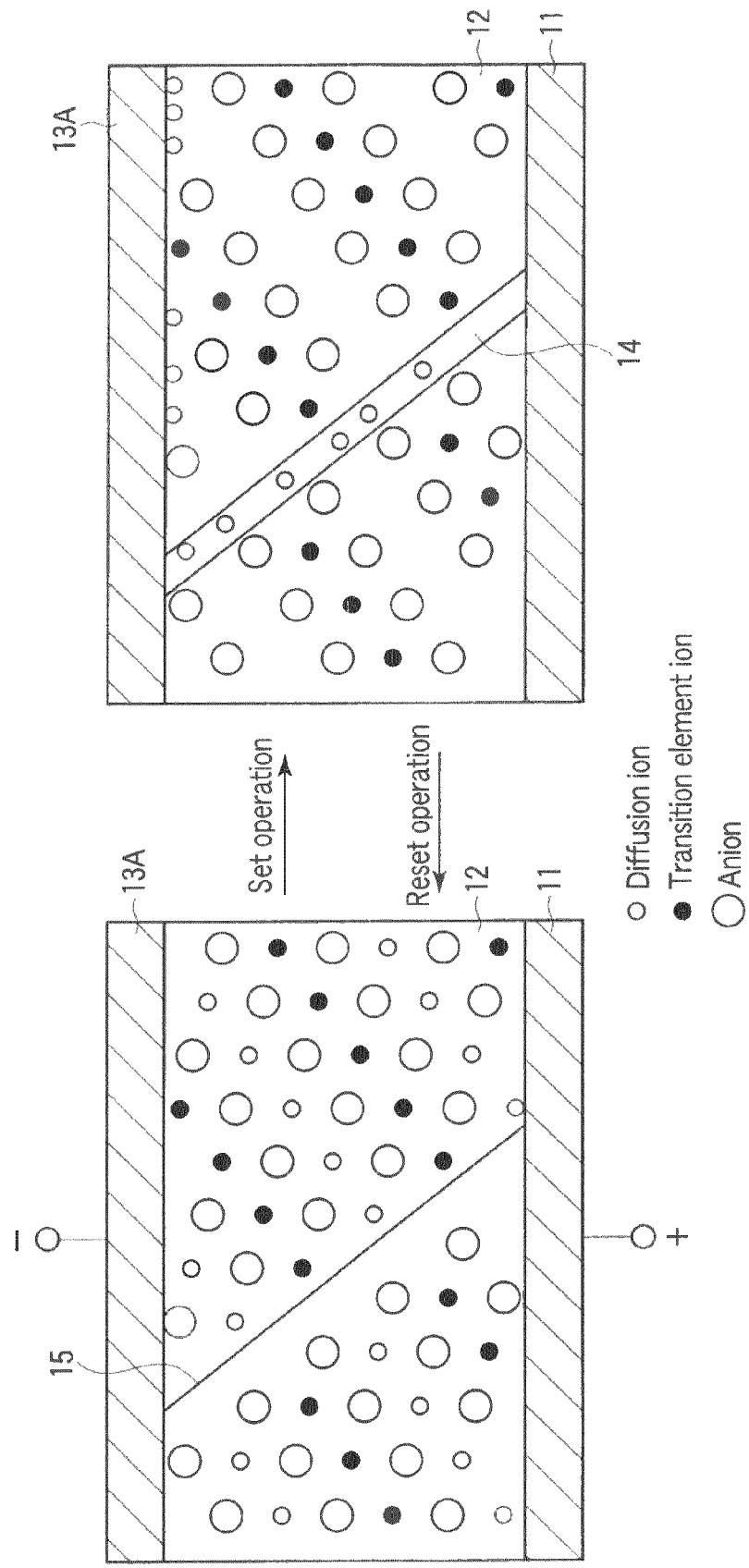
F I G. 26

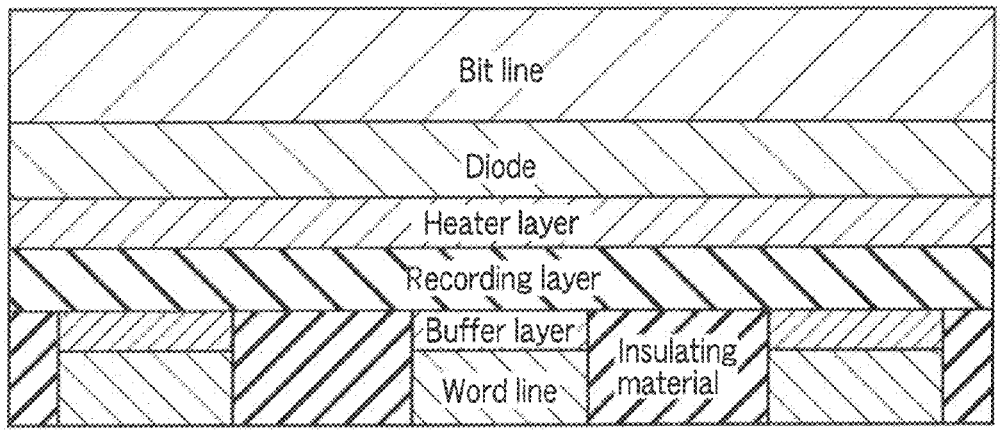
F I G. 27
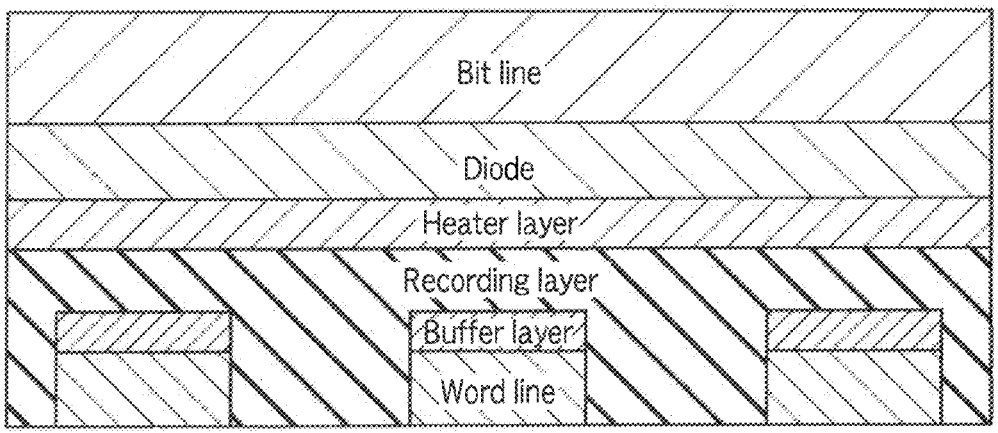
F I G. 28
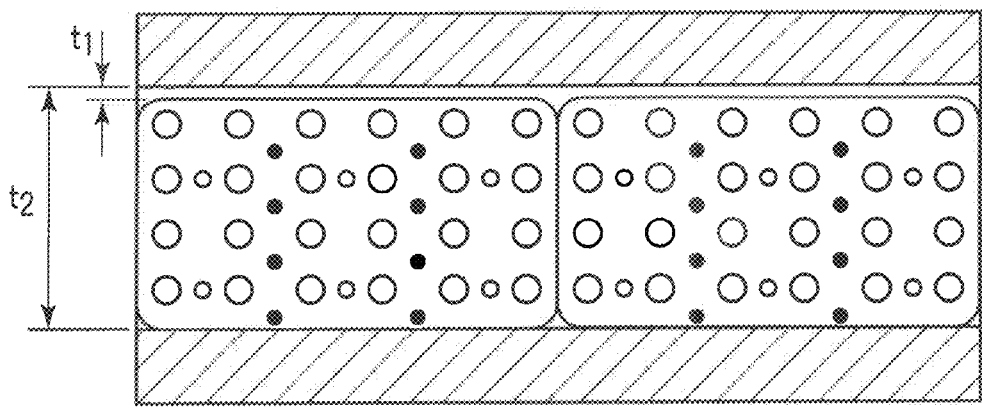
F I G. 29

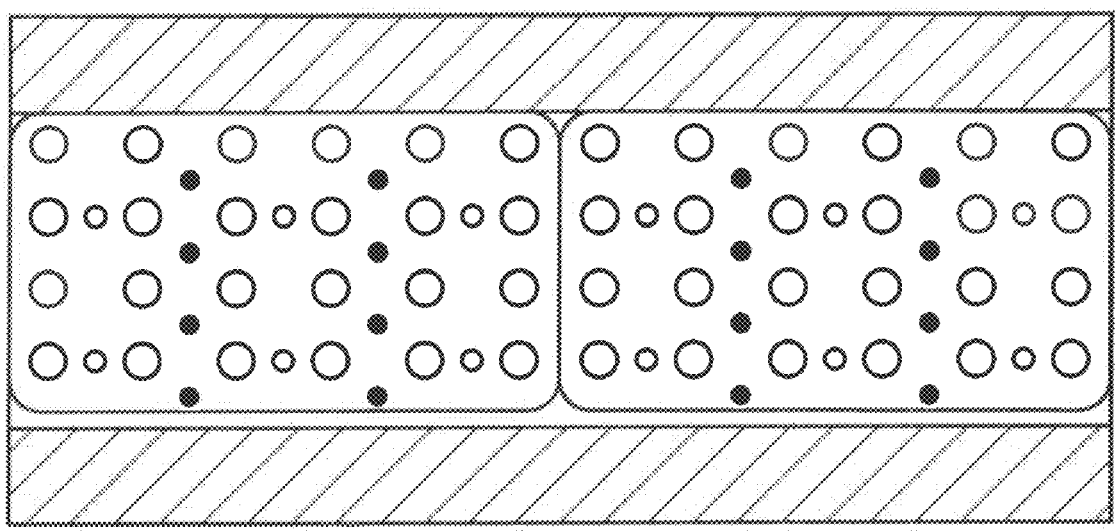
F I G. 3 0

INFORMATION RECORDING/REPRODUCING DEVICE

CROSS REFERENCE TO RELATED APPLICATIONS

This is a Continuation Application of PCT Application No. PCT/JP2008/060563, filed Jun. 9, 2008, which was published under PCT Article 21(2) in Japanese.

This application is based upon and claims the benefit of priority from prior Japanese Patent Application No. 2007-155678, filed Jun. 12, 2007, the entire contents of which are incorporated herein by reference.

BACKGROUND OF THE INVENTION

1. Field of the Invention

The present invention relates to an information recording/reproducing device with a high recording density.

2. Description of the Related Art

In recent years, compact portable devices have been widely used worldwide and, at the same time, a demand for a small-sized and large-capacity nonvolatile memory has been expanding rapidly along with the extensive progress of a high-speed information transmission network. Among them, particularly a NAND type flash memory and a small-sized HDD (hard disk drive) have rapidly evolved in recording density, and accordingly, they now form a large market.

On the contrary, some ideas for a new memory have been proposed, with the goal of greatly increasing the limit of recording density.

For instance, PRAM (phase change memory) adopts a principle in which materials capable of taking two conditions, an amorphous condition (OFF) and crystalline condition (ON), are used as recording materials, and these two conditions are caused to correspond to binary data "0" and "1" to record data.

Write/erase is performed in such a way that, for instance, the amorphous condition is prepared by applying a large power pulse to the recording material, and the crystalline condition is prepared by applying a small power pulse to the recording material.

A read is performed by causing a small read current to flow in the recording material to the degree that the write/erase is not generated, followed by measuring an electric resistance of the recording material. The resistance value of the recording material in the amorphous condition is larger than the resistance value of the recording material in the crystalline condition, and its ratio is in the degree of $10^3$.

The greatest feature of the PRAM lies in a point that, even though element size is reduced to about 10 nm, the element can be operated. In this case, since the recording density of about 10 Tbpsi (tera bytes per square inch) can be realized, and accordingly, this is one of candidates for realizing increased recording density (for instance, refer to JP-A 2005-252068 (KOKAI)).

Further, a new memory has been reported which is different from the PRAM but has a very similar operation principle to the PRAM (for instance, refer to JP-A 2004-234707 (KOKAI)).

According to this report, a representative example of a recording material to record data is nickel oxide, in which, like the PRAM, the large power pulse and the small power pulse are used for performing the write/erase. There has been reported an advantage that the power consumption at the time of the write/erase becomes small as compared with the PRAM.

Until now, although the details of an operation mechanism of the new memory are not clear, reproducibility is confirmed, and thus this is noticed as one of the candidates for the increased recording density. Further, some research groups are attempting to clarify the operation mechanism.

In addition thereto, proposed is a MEMS memory using MEMS (micro electro mechanical system) technology (for instance, refer to P. Vettiger, G. Cross, M. Despont, U. Drechsler, U. Durig, B. Gotsmann, W. Haberle, M. A. Lants, H. E. Rothuizen, R. Stutz and G. K. Binng, IEEE Trans. Nanotechnology 1, 39 (2002)).

In particular, the MEMS memory, called Millipede, has a structure in which array shaped cantilevers face a recording medium to which an organic substance is applied, and a probe at a tip of the cantilever comes into contact with the recording medium with appropriate pressure.

A write is performed by selectively controlling the temperature of a heater added to the probe. That is, when increasing the temperature of the heater, the recording medium is softened, and then, depressions are formed on the recording medium because the probe forms dents in the recording medium.

A read is performed by scanning the probe on a surface of the recording medium while causing a current to flow through the probe to the degree that the recording medium is not softened. When the probe sinks into the depression of the recording medium, temperature of the probe decreases, and the resistance value of the heater increases, so that it is possible to sense the data by reading this change of resistance value.

The greatest feature of the MEMS memory such as the Millipede lies in a point that since it is not necessary for each recording part to provide wiring to record bit data, the recording density can be improved remarkably. Under existing circumstances, a recording density of about 1 Tbps has already been achieved (for instance, refer to P. Vettiger, T. Albrecht, M. Despond, U. Drechsler, U. Durig, B. Gotsmann, D. Jubin, W. Haberle, M. A. Lants, H. E. Rothuizen, R. Stutz, D. Wiesmann and G. K. Binng, P. Bachtold, G. Cherubini, C. Hagleitner, T. Loeliger, A. Pantazi, H. Pozidis and E. Eleftheriou, in Technical Digest, IEDM03 pp. 763 to 766).

Further, subsequent to the Millipede, recently, performed are attempts to achieve a large improvement concerning power consumption, recording density or working speed while combining the MEMS technique with a new recording principle.

For instance, proposed is a system in which a ferroelectric layer is provided on the recording medium, and recording of the data is performed by causing dielectric polarization in the ferroelectric layer by applying a voltage to the recording medium. Theoretically, this system is predicted to be able to utilize one crystal as a unit (recording minimum unit) for recording one byte of data.

If the recording minimum unit is equivalent to one unit cell of the crystal of the ferroelectric layer, the recording density rises to a phenomenal approx. 4 Pbpsi (peta bytes per square inch).

The MEMS memory which stores data by using the ferroelectric layer is operated by a well-known principle, but the MEMS memory is not realized at the present time.

One of the biggest reasons is that the electric field from the recording medium is shielded by ions in an air. In other words, reading does not execute, because the electric field from the recording medium is not sensed.

The other reason is that a lattice defect in a crystal shields charges, because charges caused by the lattice defect are transferred to the recording part.

About the problem of the electric shield by ions in an air, recently, based on development of a read system using SNDM (scanning nonlinear dielectric microscope), the new memory has advanced considerably toward practical use (for instance, refer to A. Onoue, S. Hashimoto, Y. Chu, Mat. Sci. Eng. B120, 130 (2005)).

BRIEF SUMMARY OF THE INVENTION

The present invention proposes a nonvolatile information recording/reproducing device with high recording density and low power consumption.

The inventors conduct research on a resistance change phenomenon in oxides and find that diffusion of a cation in the oxide and an attendant change of a valence of an ion contribute to the resistance change phenomenon.

That is, in order to cause the resistance change with small power consumption, it is only necessary to facilitate the diffusion of the cation. Therefore, the invention has a configuration in which a large-size diffusion path is provided in order to cause the resistance change with small power consumption.

In accordance with an aspect of the invention, an information recording/reproducing device includes a recording layer, and means for recording information to the recording layer by causing a phase change in the recording layer by applying voltage to the recording layer, wherein the information recording/reproducing device includes a first chemical compound having a spinel structure, which is represented by Chemical Formula 1: $A_xM_yX_4$ ($0.1 \leq x \leq 2.2$, $1.0 \leq y \leq 2$), where A includes at least one element selected from a group of Zn, Cd, and Hg, M includes at least one transition element selected from a group of Ti, Zr, Hf, V, Nb, and Ta, and X includes O.

In the information recording/reproducing device in accordance with an aspect of the invention including a recording layer, and means for recording information to the recording layer by causing a phase change in the recording layer by applying voltage to the recording layer, the recording layer includes a first chemical compound having the spinel structure and a second chemical compound having a vacant site which a cation element in the spinel structure can occupy.

Accordingly, the nonvolatile information recording/reproducing device with high recording density and low power consumption can be implemented in the invention.

BRIEF DESCRIPTION OF THE SEVERAL VIEWS OF THE DRAWING

FIGS. 1 to 3 are views, each showing a recording principle.
FIG. 16 is a view showing an application example for a flash memory.
FIGS. 17 to 20 are views, each showing a NAND cell unit.

FIG. 26 is a view showing a recording principle.
FIGS. 27 and 28 are views, each showing an example of a memory cell array structure.
FIGS. 29 and 30 are views, each showing a modified example of a recording layer.

DETAILED DESCRIPTION OF THE INVENTION

Figure 2:
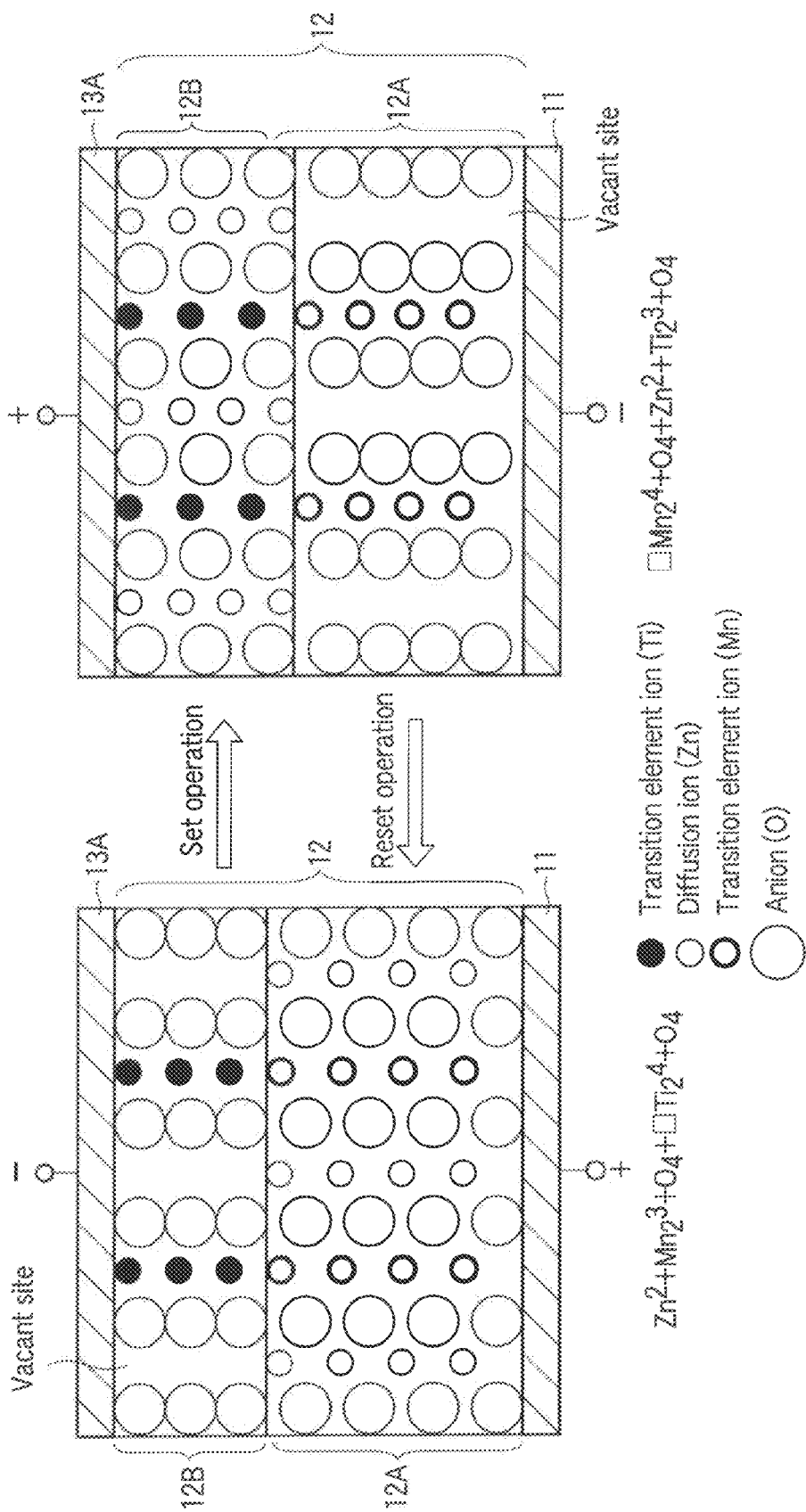

An information recording/reproducing device of an aspect of the present invention will be described below in detail with reference to the accompanying drawing.

1. Outline (1) An information recording/reproducing device according to a first example of the invention includes a recording layer including at least a first chemical compound having a spinel structure which is represented by Chemical Formula 1: $A_xM_yX_4$ ($0.1 \leq x \leq 2.2$, $1.0 \leq y \leq 2$), where A includes at least one element selected from a group of Zn, Cd, and Hg, M includes at least one transition element selected from a group of Ti, Zr, Hf, V, Nb, and Ta, and X includes O.

As to molar ratios x and y, a lower limit of a numeric range is set in order to maintain a crystal structure, and an upper limit thereof is set in order to control an electron state in a crystal.

The use of these elements enlarges the diffusion path of the A ion, which allows realization of the low power consumption.

The use of such recording layer can realize the Pbpsi-level recording density in principle and also achieve the low power consumption.

(2) In an information recording/reproducing device according to a second example of the invention, the recording layer includes a first chemical compound having a spinel structure and a second chemical compound having a vacant site which a cation element can occupy.

The second chemical compound is one of:

  Chemical Formula 2 where □ is a vacant site which the cation element can occupy, M2 is at least one element selected from Ti, Ge, Sn, V, Cr, Mn, Fe, Co, Ni, Nb, Ta, Mo, W, Re, Ru, and Rh, X2 is at least one element selected from O, S, Se, N, Cl, Br, and I, and $0.3 \leq x \leq 1$;

  Chemical Formula 3 where □ is a vacant site which the cation element can occupy, M2 is at least one element selected from Ti, Ge, Sn, V, Cr, Mn, Fe, Co, Ni, Nb, Ta, Mo, W, Re, Ru, and Rh, X2 is at least one element selected from O, S, Se, N, Cl, Br, and I, and $1 \leq x \leq 2$;

  Chemical Formula 4 where □ is a vacant site which the cation element can occupy, M2 is at least one element selected from Ti, Ge, Sn, V, Cr, Mn, Fe, Co, Ni, Nb, Ta, Mo, W, Re, Ru, and Rh, X3 is at least one element selected from O, S, Se, N, Cl, Br, and I, and $1 \leq x \leq 2$;

  Chemical Formula 5 where □ is a vacant site which the cation element can occupy, M2 is at least one element selected from Ti, Ge, Sn, V, Cr, Mn, Fe, Co, Ni, Nb, Ta, Mo, W, Re, Ru, and Rh, P is phosphorus, O is oxygen, $0.3 \leq x \leq 3$, and $4 \leq z \leq 6$; and

  Chemical Formula 6 where □ is a vacant site which the cation element can occupy, M2 is at least one element selected from V, Cr, Mn, Fe, Co, Ni, Nb, Ta, Mo, W, Re, Ru, and Rh, O is oxygen, and $0.3 \leq x \leq 2$.

In Chemical Formulae 2 to 6, □ is a vacant site which A element can occupy. Alternatively, other ions may occupy a part of the vacant sites in order to facilitate film deposition of the second chemical compound 12B.

The second chemical compound has one of crystal structures such as a hollandite structure, a ramsdellite structure, an anatase structure, a brookite structure, a pyrolusite structure, a $ReO_3$ structure, a $MoO_{1.5}PO_4$ structure, a $Ti_{0.5}PO_4$ structure, an $FePO_4$ structure, a $\beta MnO_2$ structure, a $\gamma MnO_2$ structure, and a $\lambda MnO_2$ structure.

A Fermi level of an electron of the first chemical compound is set lower than a Fermi level of an electron of the second chemical compound. This is one of necessary conditions that reversibility is imparted to the state of the recording layer. At this point, a value measured from a vacuum level is used as each Fermi level.

The use of the above-described recording layer can realize the Pbpsi-level recording density in principle and also achieve the low power consumption.

2. Basic Principle of Recording/Erasing/Reproducing (1) A basic principle of recording/erasing/reproducing of data in the information recording/reproducing device of the first example of the invention will be described.

FIG. 1 shows a structure of a recording unit.

In FIG. 1, the reference number 11 denotes an electrode layer, the reference number 12 denotes a recording layer, and the reference number 13A denotes an electrode layer (or protection layer).

A small white circle in the recording layer 12 expresses a diffusion ion, and a large white circle expresses an anion (X ion). A small black circle expresses a transition element ion. Typically the diffusion ion corresponds to the A ion, and the transition element ion corresponds to the M ion.

A part of the diffusion ions transfers in the crystal, when a voltage is applied to the recording layer 12 to generate a potential gradient in the recording layer 12. Therefore, in the first example, an initial state of the recording layer 12 is set to an insulating material (high-resistance state), and the phase change of the recording layer 12 is caused to impart conductivity (low-resistance state) to the recording layer 12 by the potential gradient, thereby performing the recording.

First, for example, a potential at the electrode layer 13A is set relatively lower than a potential at the electrode layer 11. A negative potential may be imparted to the electrode layer 13A when the electrode layer 11 is set to a fixed potential (for example, ground potential).

At this point, a part of the diffusion ions in the recording layer 12 transfers onto the side of the electrode layer (negative electrode) 13A, and the number of diffusion ions in the recording layer (crystal) 12 is relatively decreased with respect to the number of anions. The diffusion ions which transfer onto the side of the electrode layer 13A receive electrons from the electrode layer 13A, and the diffusion ions are deposited as metal, thereby forming a metallic layer 14.

Alternatively, for example, when the vacant site which the diffusion ion can occupy exists in the crystal structure of the recording layer 12 like the spinel structure, the vacant site on the side of the electrode layer 13A may be filled with the diffusion ion which transfers onto the side of the electrode layer 13A. In such cases, in order to satisfy a neutral condition of a local charge, the diffusion ion receives the electron from the electrode layer 13A to act as metal.

The number of anions becomes excessive in the recording layer 12, which increases the valence of the transition element ion in the recording layer 12. That is, because the recording layer 12 acquires the electron conductivity by the injection of the carrier, the recording (set operation) is completed.

A current pulse is passed through the recording layer 12 to detect the resistance of the recording layer 12, thereby easily performing the reproducing. However, it is necessary to set the current pulse to a minute value of an extent that a material constituting the recording layer 12 does not cause the resistance change.

The above-described process is a kind of electrolysis, and it can be considered that an oxidant is generated on the side of the electrode layer (positive electrode) 11 by electrochemical oxidation while a reducing agent is generated on the side of the electrode layer (negative electrode) 13A by electrochemical reduction.

Therefore, in order to return the recording state (low-resistance state) to the initial state (high-resistance state), for example, Joule heating of the recording layer 12 may be performed by a large current pulse to promote an oxidation-reduction reaction of the recording layer 12. That is, the recording layer 12 is returned to the insulating material by residual heat after the large current pulse is cut off (reset operation).

Alternatively, the reset operation may be performed by applying an electric field opposite to that of the set operation. That is, as with the set operation, when the electrode layer 11 is set to the fixed potential, the positive potential may be imparted to the electrode layer 13A. Therefore, in addition to the oxidation-reduction reaction by the Joule heat, the metallic layer is oxidized near the electrode layer 13A to become the cation, and the cation is returned into the matrix structure by a potential gradient in the recording layer 12. Because the valence is decreased to the same value as the pre-set operation in the transition element ion whose valence is increased, the recording layer 12 is returned to the initial insulating material.

However, in order to put the operation principle into practical use, it is necessary to confirm that the reset operation is not caused at room temperature (securement of sufficiently long retention time) and that the power consumption is sufficiently small in the reset operation.

The problem with the securement of the sufficiently long retention time can be solved by imparting the valence of at least two to the diffusion ion.

When the diffusion ion has the valence of one like a Li ion, a sufficient ion transfer resistance is not obtained in the set state, the diffusion ion element is instantaneously returned from the metallic layer 14 into the recording layer 12. In other words, the sufficiently long retention time is not obtained.

When the diffusion ion has the valence of at least three, because the voltage necessary for the set operation is increased, possibly collapse of the crystal is caused in the worst case.

Accordingly, preferably the diffusion ion (A ion) has the valence of two in the information recording/reproducing device.

The problem with the sufficiently small power consumption in the reset operation can be solved by a structure having the transfer path, in which an ion radius of the diffusion ion is optimized such that the diffusion ion can transfer in the recording layer (crystal) 12 without causing the collapse of the crystal. The above-described elements and crystal structures may be used as such recording layer 12.

Particularly, it is well known that the cation transfer easily in the spinel structure, so that preferably the spinel structure may be used as the recording layer 12. However, even in such spinel structure, it is necessary to optimize a combination of the A ion and the M ion in order to cause repeatedly stable switching (ion transfer).

An example, in which the A ion corresponds to the diffusion ion of FIG. 1 while the M ion corresponds to the transition element ion of FIG. 1 in the spinel structure expressed by Chemical Formula $AM_2X_4$, will be described below.

The transfer of the A ion is easily caused, when Zn, Cd, and Hg are used as the A ion while 4A-group and 5A-group elements are used as transition element ion. Coordination of Zn, Cd, and Hg in an A site of the spinel structure is easily caused, so that the coordination of the transition element ion having the large valence in the A site is caused to prevent the obstruction of the diffusion path of the diffusion ion. This holds true for the case in which a ratio of the A ion and the M ion deviates from a stoichometric composition of 1/2. On the other hand, when Ti, Zr, Hf, V, Nb, and Ta are used as the transition element ion, a lattice constant of the spinel structure can be enlarged because of the large ion radius. Therefore, the size of the diffusion path in the spinel structure can be enlarged to facilitate the transfer of the diffusion ion.

An effect that the composition deviates from the stoichometric composition will be described below. In the composition, when the ration of the number of atoms of the Zn ion and the Ti ion or V ion is set larger than 1/2, the Zn ion can easily occupy a part of the sites which the transition element ion expressed by a large white circle occupies in FIG. 1. This enables the structure stability to be imparted to the spinel structure.

For example, when Ti is used as the M ion, Ti exists as not the usual trivalent ion but the tetravalent ion near the Zn ion which can occupy a B site to satisfy the neutral condition of the charge. At this point, when the Zn ion which can occupy the A site transfers near the Zn ion which can occupy the B site, the left Zn ion does not have the valence of at least two, and Ti valence does not have the valence of at least four. Because the neutral condition of the local charge cannot be satisfied, the Zn ion which can occupy the A site hardly transfers near the Zn ion which can occupy the B site. Therefore, because a region where the transfer of the diffusion ion is not caused, that is, the phase change is not caused exists in the crystal structure, the crystal structure is easily retained even if the recording layer is maintained at a high temperature. Further, because Ti stably exhibits the tetravalent state such that Ti exists as $TiO_2$, the stable crystal structure is easy to retain. That is, the recording layer structure exists stably. However, when Ti is used as the M element, the state in which the crystal structure includes the A ion in the film deposition corresponds to the low-resistance state, and the state in which the A ion is released from the crystal structure corresponds to the high-resistance state.

When V is used as the M ion, when the Zn ion which exists in the A site diffuses near the Zn ion which can occupy the B site, the tetravalent V ion near the diffused Zn ion becomes the pentavalent V ion, which allows the satisfaction of the neutral condition of the charge. When the V ion has the valence of three of four, it is well known that a metal-insulating material transition is made near room temperature because of a strong interaction between the electrons. However, the interaction between the electrons can be reduced by replacing a part of the B sites of the spinel structure with the Zn ion, and therefore the thermal stability of the recording layer structure can be improved even if V is used as the M ion.

Preferably M is at least one element selected from Ti and V. This is because the electron state in the crystal is easily controlled when Ti and V are used. In cases where M is a 4A-group atom, the number of cations which can increase the valence is decreased when the ratio of the A ion and the M ion comes close to two, and the sufficient resistance change is hardly obtained. Therefore, more preferably M is a 5A-group. More preferably, when the 5A-group is used as M, it is well known that the spinel structure is stably exhibited in a wide range of the x/y ratio in Chemical Formula 1: $A_xM_yX_4$. Accordingly, more preferably M includes V.

Finally an optimum value of a mixture ratio of the atoms will be described below.

There is a slightly arbitrary property in the mixture ratio of the A ion, when the vacant site which the A ion can occupy exists, or when the A ion can occupy the site which the M ion fundamentally occupies.

Accordingly, the mixture ratio of the A ion is set in a range of $0.1 \leq x \leq 2.2$. Actually the mixture ratio of the A ion can be optimized such that the resistance of each state or a diffusion coefficient of the A ion becomes an optimum value.

When the mixture ratio of the A ion is excessively small, it is difficult to stably produce and retain the structure. When the mixture ratio of the A ion is excessively large, it is difficult to diffuse the A ion. Accordingly, more preferably the mixture ratio of the A ion is set in the range of $0.5 \leq x \leq 1.8$.

When the mixture ratio of the M ion exceeds two, it is necessary to locate the M ion in the site which the A ion can fundamentally occupy, so it is difficult to diffuse the A ion. Accordingly, preferably the mixture ratio of the M ion is set in the range of $1.0 \leq y \leq 2$. On the other hand, when the total amount of ion which can occupy the site of the M ion is excessively small, it is difficult to stably retain the structure after the A ion is drawn. Accordingly, preferably the mixture ratio of the M ion is set in the range of $1.2 \leq y \leq 2$. However, preferably the mixture ratio of the A ion and the M ion is set in the range of $2.2 \leq x+y \leq 3.1$ in order to decrease the number of vacancies in the B site to stably retain the structure after the A ion is drawn.

On the other hand, in order to obtain the effect of the structure stability as described above, preferably the A ion can occupy a part of the B sites in the spinel structure. Therefore, preferably the mixture ratio of the A ion and the M ion is set in the ranges of $0.7 \leq x \leq 1.6$, $1.0 \leq y \leq 2.0$, and $2.5 \leq x+y \leq 3.1$ in Chemical Formula 1: $AxM_yX_4$. The mixture ratio of the A ion and the M ion may be set in the range of $1.0 \leq y \leq 1.5$ in order to further obtain the effect of the structure stability. The reason that the value of x+y exceeds three is that defective oxygen is simulated.

The case in which the sufficiently large crystal is obtained is described in FIG. 1. On the other hand, even if the crystal is disposed while divided in a film thickness direction as shown in FIG. 26, the transfer of the A ion and the corresponding resistance change are caused by the mechanism described in the invention.

That is, when the negative voltage is applied to the electrode layer 13 while the electrode layer 11 is grounded, the potential gradient is generated in the recording layer 12 to transport the A ion. When the A ion transfers to a crystal interface, the A ion gradually receives the electron from the region close to the electrode layer 13A, and the A ion behaves as metal. As a result, the metallic layer 14 is formed near the crystal interface.

The conductivity of the recording layer 12 increases because the valence of the transition element ion increases in the recording layer 12. In such cases, a conductive path of the metallic layer is formed along the crystal interface, the resistance between the electrode layer 11 and the electrode layer 13 decreases, and the element is changed to a low-resistance-state phase.

In this case, the A ion at the crystal interface is returned into the spinel structure by the Joule heating using the large current pulse or the application of the reversed voltage pulse, which allows the low-resistance-state phase to be changed to the high-resistance-state phase.

However, in order that the transfer of the diffusion ion is efficiently caused to the applied voltage as shown in FIG. 1, preferably the direction in which the diffusion ion diffuses and the direction in which the electric field is applied are matched with each other.

In the spinel structure, as shown in FIG. 1, when the c-axis of the recording layer is orientated in parallel with the film surface, preferably the transfer path is disposed in the direction in which the electrodes are connected. When a [110] direction of the recording layer is orientated substantially perpendicular to the recording layer, the transfer path is disposed in substantially parallel with the electric field. Therefore, more preferably the recording layer is substantially orientated toward a (110) direction.

The inside of the crystal structure differs from a circumferential portion of the crystal grain in the ease of ion transfer. Therefore, in order to utilize the transfer of the diffusion ion in the crystal structure to equalize recording/erasing property in different positions, preferably the recording layer includes a polycrystalline state or a single crystal state. When the recording layer is in the polycrystalline state, in consideration of the ease of the film deposition, preferably a size in a sectional direction of the recording film of the crystal grain follows a distribution having a single peak, and an average of the crystal grain size is 3 nm or more. Preferably the average of the crystal grain size is not lower than 5 nm because the film is deposited more easily, and more preferably the average of the crystal grain size is not lower than 10 nm because the recording/erasing property can further be equalized in different positions.

The film thickness of the recording layer may appropriately be set such that the resistances of the high-resistance-state phase and low-resistance-state phase become desired values. Typically the film thickness of the recording layer ranges from 1 to 500 nm. When a recording region is reduced, preferably the film thickness of the recording layer is smaller than ten times the recording region in order to suppress the expansion of the recording layer in an in-plane direction.

Because the oxidant is generated on the side of the electrode layer (positive electrode) 11 after the set operation, preferably the electrode layer 11 is made of a material (such as electric conductive nitride and electric conductive oxide) which is hardly oxidized.

Preferably the material used for the electrode layer 11 does not have ion conductivity.

The materials used for the electrode layer 11 are listed below. Among others, $LaNiO_3$ is most suitable from the viewpoint of overall performance including the good electric conductivity.

MN

M is at least one element selected from the group of Ti, Zr, Hf, V, Nb, and Ta, and N is nitrogen.

$MO_X$

M is at least one element selected from the group of Ti, V, Cr, Mn, Fe, Co, Ni, Cu, Zr, Nb, Mo, Ru, Rh, Pd, Ag, Hf, Ta, W, Re, Ir, Os, and Pt. It is assumed that the molar ratio x satisfies $1 \leq x \leq 4$.

$AMO_3$

A is at least one element selected from the group of La, K, Ca, Sr, Ba, and Ln [Lanthanide].

M is at least one element selected from the group of Ti, V, Cr, Mn, Fe, Co, Ni, Cu, Zr, Nb, Mo, Ru, Rh, Pd, Ag, Hf, Ta, W, Re, Ir, Os, and Pt, and O is oxygen.

$A_2MO_4$

A is at least one element selected from the group of K, Ca, Sr, Ba, and Ln [Lanthanide].

M is at least one element selected from the group of Ti, V, Cr, Mn, Fe, Co, Ni, Cu, Zr, Nb, Mo, Ru, Rh, Pd, Ag, Hf, Ta, W, Re, Ir, Os, and Pt, and O is oxygen.

Because the reducing agent is generated on the side of the protection layer (negative electrode) 13 after the set operation, preferably the protection layer 13 has a function of preventing the recording layer 12 from reacting with the atmosphere.

Alternatively, a buffer layer may be provided between the recording layer and the electrode layer 11 in order to control the orientation of the recording layer. Oxides of Ir or Ru and nitrides of Si, Ti, Zr, Hf, V, Nb, Ta, and W may be cited as an example of a material suitable for the buffer layer. In addition, preferably the buffer layer is orientated so as to become an integral multiple of a lattice constant of the recording layer orientated toward the desired direction. The nitrides of Ti, V, W, Zr, and Hf, which are orientated toward the (100), (110), or (111) direction may be cited as a preferred example.

Examples of such material include semiconductor materials such as amorphous carbon, diamond-like carbon, and $SnO_2$.

The electrode layer 13A may act as a protection layer which protects the recording layer 12, or the protection layer may be provided instead of the electrode layer 13A. In such cases, the protection layer may be made of an insulating material or a conductive material.

In order to efficiently heat the recording layer 12 in the reset operation, a heater layer (made of a material having resistivity of about $10^{-5}$ Ωcm or more) may be provided on the negative electrode side (in the example, on the side of the electrode layer 13A).

(2) A basic principle of recording/erasing/reproducing of information in the information recording/reproducing device of the second example of the invention will be described.

FIG. 2 shows a structure of a recording unit.

In FIG. 2, the reference number 11 denotes an electrode layer, the reference number 12 denotes a recording layer, and the reference number 13A denotes an electrode layer (or protection layer).

The recording layer 12 includes a first chemical compound 12A and a second chemical compound 12B. The first chemical compound 12A is expressed by $A_xM_yX_4$, and the first chemical compound 12A is disposed on the side of the electrode layer 11. The second chemical compound 12B is disposed on the side of the electrode layer 13A, and the second chemical compound 12B has a vacant site which the cation element of the first chemical compound 12A can occupy.

A small white circle indicated by a bold line in the first chemical compound 12A expresses a transition element ion (typically M ion), a small white circle in the first chemical compound 12A expresses a diffusion ion (typically A ion), and a black circle in the second chemical compound 12B expresses a transition element ion (M2 ion). A large circle expresses an anion (X ion in the first chemical compound 12A, and X2 ion in the second chemical compound 12B).

Figure 3:
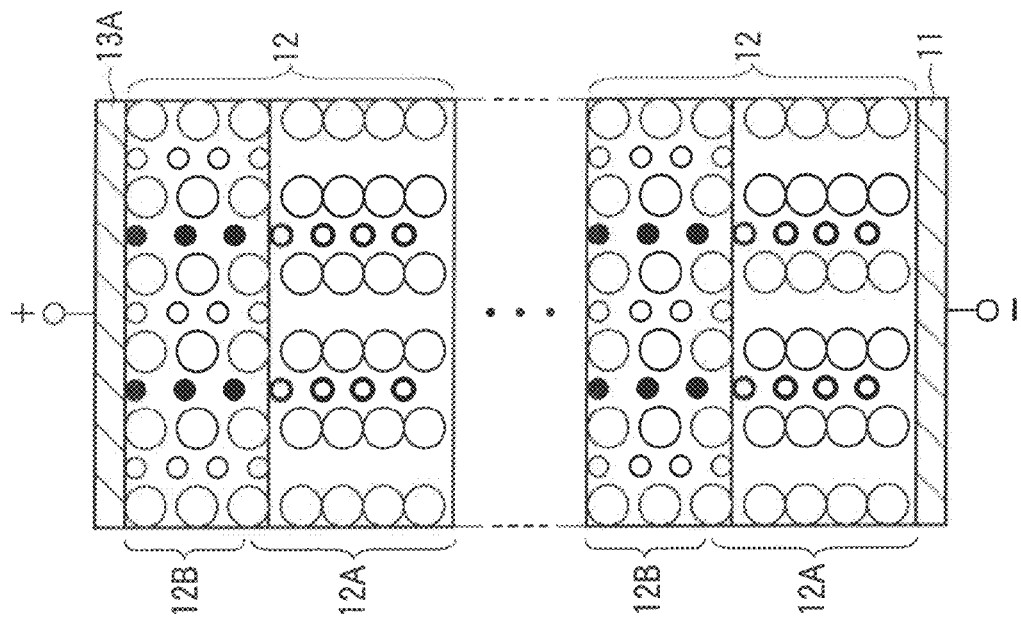
Figure 3:
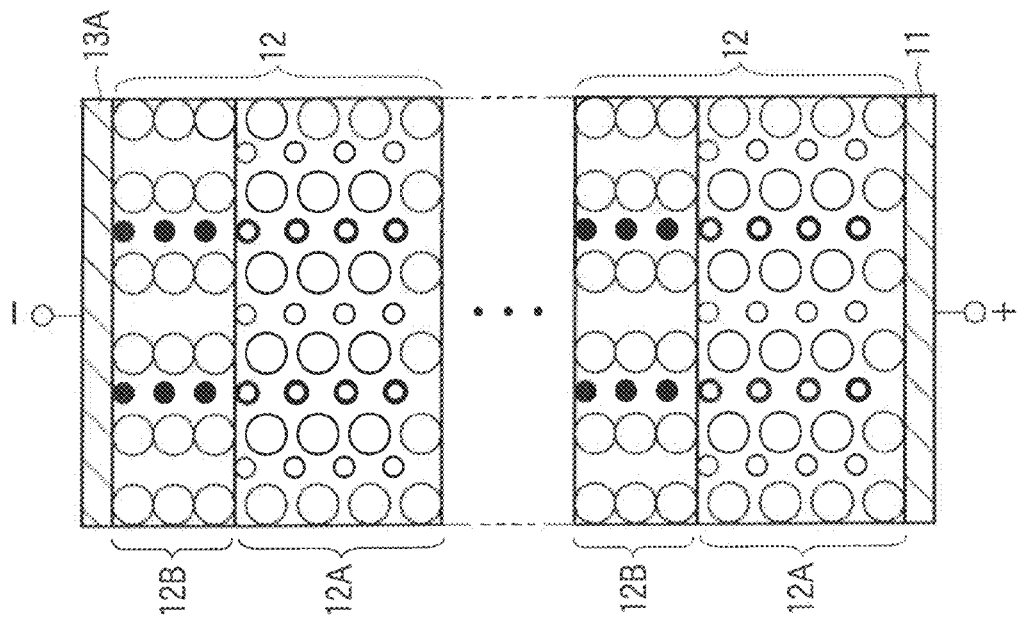

As shown in FIG. 3, the first and second chemical compounds 12A and 12B constituting the recording unit 12 may be stacked into at least two layers.

In the recording unit of FIG. 2, potentials are imparted to the electrode layers 11 and 13A to generate the potential gradient in the recording layer 12 such that the first chemical compound 12A becomes the positive electrode side while the second chemical compound 12B becomes the negative electrode side. Therefore, a part of the diffusion ions in the first chemical compound 12A transfers in the crystal and proceeds into the second chemical compound 12B on the negative electrode side.

Because the vacant site which the diffusion ion can occupy exists in the crystal of the second chemical compound 12B, the diffusion ion which transfers from the first chemical compound 12A can occupy the vacant site.

Accordingly, the valence of the transition element ion increases in the first chemical compound 12A, and the valence of the transition element ion decreases in the second chemical compound 12B.

For the initial state (reset state), when it is assumed that the first and second chemical compounds 12A and 12B are in the high-resistance state (insulating material), a part of the diffusion ions in the first chemical compound 12A transfers into the second chemical compound 12B. Therefore, conductive carriers are generated in the first and second chemical compounds 12A and 12B, and the first and second chemical compounds 12A and 12B have the electric conductivity.

As described above, the current/voltage pulse is imparted to the recording layer 12 to decrease the electrical resistance of the recording layer 12, thereby realizing the set operation (recording).

At the same time, the electron also transfers from the first chemical compound 12A to the second chemical compound 12B. However, because the Fermi level of the electron of the second chemical compound 12B is higher than the Fermi level of the electron of the first chemical compound 12A, the total energy of the recording layer 12 rises.

Because the high energy state is continued after the set operation is completed, there is a risk of naturally returning the recording layer 12 from the set state (low-resistance state) to the reset state (high-resistance state).

However, the use of the recording layer 12 of the second example of the invention avoids the risk. That is, the set state can be maintained.

This is because the so-called ion transfer resistance acts.

The valence of the diffusion ion in the first chemical compound 12A plays a role of the action. The divalent diffusion ion has an important meaning.

When the diffusion ion has the valence of one like the Li ion, the sufficient ion transfer resistance can not be obtained in the set state, and the diffusion ion is instantaneously returned from the second chemical compound 12B to the first chemical compound 12A. In other words, the sufficiently long retention time can not be obtained.

When the diffusion ion has the valence of at least three, because the voltage necessary for the set operation is increased, possibly the collapse of the crystal is caused in the worst case.

Accordingly, preferably the diffusion ion has the valence of two in the information recording/reproducing device.

Because the oxidant is generated on the positive electrode side after the set operation is completed, preferably the electrode layer 11 is made of a material (for example, electric conductive oxide) which is hardly oxidized and does not have the ion conductivity in this case. The preferred example is described above.

In the reset operation (erasing), the heating of the recording layer 12 may be performed to promote the phenomenon in which the diffusion ion which can occupy the vacant site of the second chemical compound 12B is returned to the first chemical compound 12A.

Specifically, the recording layer 12 can be easily returned to the original high-resistance state (insulating material) by utilizing the Joule heat and the residual heat of the Joule heat. The Joule heat is generated by supplying the large current pulse to the recording layer 12.

Thus, the electrical resistance of the recording layer 12 is increased by supplying the large current pulse to the recording layer 12, thereby realizing the reset operation (erasing). Alternatively, the reset operation may be performed by applying an electric field opposite to that of the set operation.

In order to realize the low power consumption, it is important to use the structure having the transfer path, in which the ion radius of the diffusion ion is optimized such that the diffusion ion can transfer in the crystal without causing the collapse of the crystal.

When the material and crystal structure described in the outline are used as the second chemical compound 12B while coming into contact with the first chemical compound having the spinel structure in which the cation transfers easily, the condition is satisfied to effectively realize the low power consumption.

When the oxide spinel is used, at least one material selected from the group of Zn, Cd, and Hg is preferably used as the diffusion ion element, and at least one material selected from the group of 4A-group and 5A-group elements is preferably used as the transition element.

From the viewpoints of the ease of cation transfer and the degree of coincidence of the lattice constant, preferably $M2X2_2$ having the hollandite structure is used as the second chemical compound which is used while preferably combined with the spinel material, and most preferably Ti is used as M2 and O is used as X2.

The spinel structure having many vacant sites is cited as an example of the second chemical compound having the high degree of coincidence of the lattice constant with that of the first chemical compound. When the material having the spinel structure having many vacant sites is used as the second chemical compound, preferably the second chemical compound is suitably orientated.

The preferred film thickness range of the second chemical compound will be described below.

In order to obtain the effect of the vacant site which the diffusion ion can occupy, preferably the second chemical compound has the film thickness of 1 nm or more.

On the other hand, when the number of vacant sites in the second chemical compound is larger than the number of diffusion ions in the first chemical compound, the effect of the resistance change of the second chemical compound is reduced. Therefore, preferably the number of vacant sites in the second chemical compound is less than or equal to the number of diffusion ions in the first chemical compound that exists in the same sectional area.

Because density of the diffusion ion in the first chemical compound is substantially equal to the density of the vacant site in the second chemical compound, preferably the film thickness of the second chemical compound is substantially less than or equal to the film thickness of the first chemical compound.

Generally, a heater layer (made of a material having resistivity of about $10^{-5}$ Ωcm or more) may be provided on the negative electrode side in order to further promote the reset operation.

In the probe memory, because a reducing material is deposited on the negative electrode side, preferably a surface protection layer is provided in order to prevent the reducing material from reacting with atmosphere.

The heater layer and the surface protection layer may be made of one material having functions of both the heater layer and the surface protection layer. For example, semiconductor materials such as amorphous carbon, diamond-like carbon, and $SnO_2$ have both the heater function and the surface protection function.

The current pulse is passed through the recording layer 12 to detect the resistance of the recording layer 12, thereby easily performing the reproducing.

However, it is necessary to set the current pulse to a minute value of an extent that the material constituting the recording layer 12 does not cause the resistance change.

3. Embodiments

Next, explanation will be made on some embodiments considered to be the best.

Hereinafter, explanation will made about two cases: a first case in which the example of the present invention is applied to a probe memory and a second case in which the example of the present invention is applied to a semiconductor memory.

(1) Probe Memory

A. Structure

Figure 4:
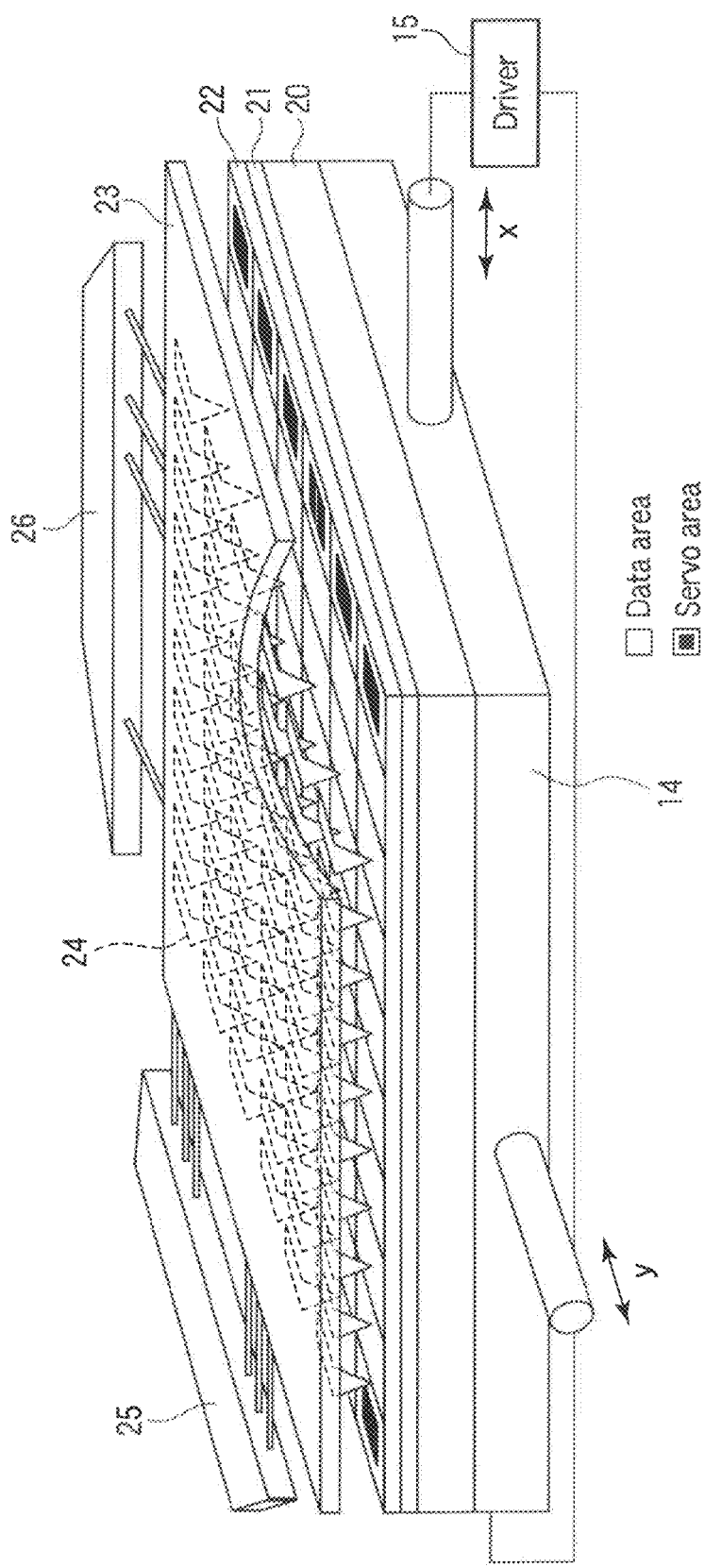
FIG. 4 is a view showing a probe memory.
Figure 5:
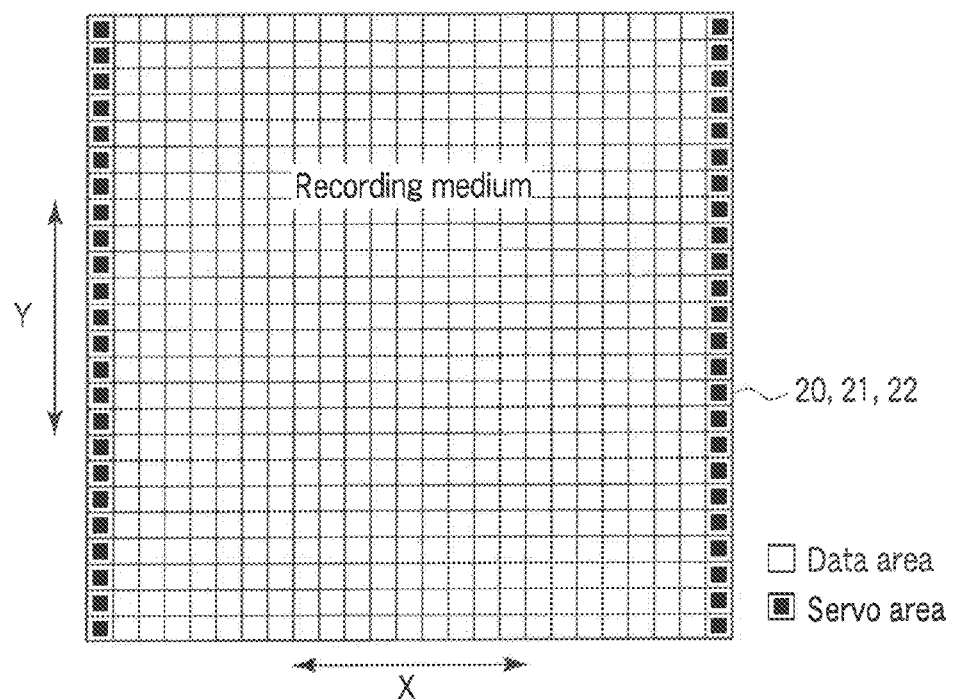
FIG. 5 is a view showing a recording medium.

FIGS. 4 and 5 show the probe memory according to the example.

A recording medium is arranged on an XY scanner 14. A probe array is arranged to face the recording medium.

The probe array has a substrate 23 and probes (heads) 24 arranged in an array shape at one face side of the substrate 23. Each of the probes 24 is comprised by, for instance, a cantilever, and driven by multiplex drivers 25, 26.

Each of the probes 24 can operate individually by using a micro actuator in the substrate 23. However, here, there will be explained an example in which access is performed to data areas of the recording medium while causing all the probes to operate in the same manner.

Firstly, by using the multiplex drivers 25, 26, all the probes 24 are caused to perform a reciprocating operation at a constant frequency in the X direction, to read position information of the Y direction from a servo area of the recording medium. The position information in the Y direction is transferred to a driver 15.

The driver 15 drives the XY scanner 14 based on the position information, causes the recording medium to move in the Y direction, and performs positioning of the recording medium and the probe.

After completing the positioning of the both, read or write of data is performed simultaneously and continuously to all the probes 24 on the data area.

The read and write of the data are performed continuously because the probe 24 is performing the reciprocating operation in the X direction. Further, the read and write of the data are executed in every one line to the data area by sequentially changing the position in the Y direction of the recording medium.

Meanwhile, it is also possible to read the position information from the recording medium while causing the recording medium to perform reciprocating movement at a constant frequency in the X direction, and then cause the probe 24 to move in the Y direction.

The recording medium is comprised, for instance, a substrate 20, an electrode layer 21 on the substrate 20, and a recording layer 22 on the electrode layer 21.

The recording area 22 has data areas, and servo areas arranged respectively at both ends in the X direction of the data areas. Data areas occupy a principal part of the recording layer 22.

Servo burst signals are recorded in the servo area. The servo burst signals indicate the position information in the Y direction in the data area.

In the recording layer 22, in addition to these pieces of information, there are arranged an address area in which address data is recorded and a preamble area to take synchronization.

The data and the servo burst signal are recorded in the recording layer 22 as recording bits (the electric resistance change).

"1", "0" information of the recording bit is read by detecting the electric resistance of the recording layer 22.

In the present example, one probe (head) corresponding to one data area is provided, and one probe corresponding to one servo area is provided.

The data area is comprised by tracks. The track of the data area is specified by address signals read from the address area. Further, the servo burst signal read from the servo area is for causing the probe 24 to move to the center of the track to eliminate read error of the recording bit.

Here, the X direction is caused to correspond to a down track direction, and the Y direction is caused to correspond to an up track direction, thereby making it possible to utilize the head position control technique of HDD.

B. Recording/Reproducing Operation Explanation will next be made about recording/reproducing operation of the probe memory of FIGS. 4 and 5.

Figure 6:
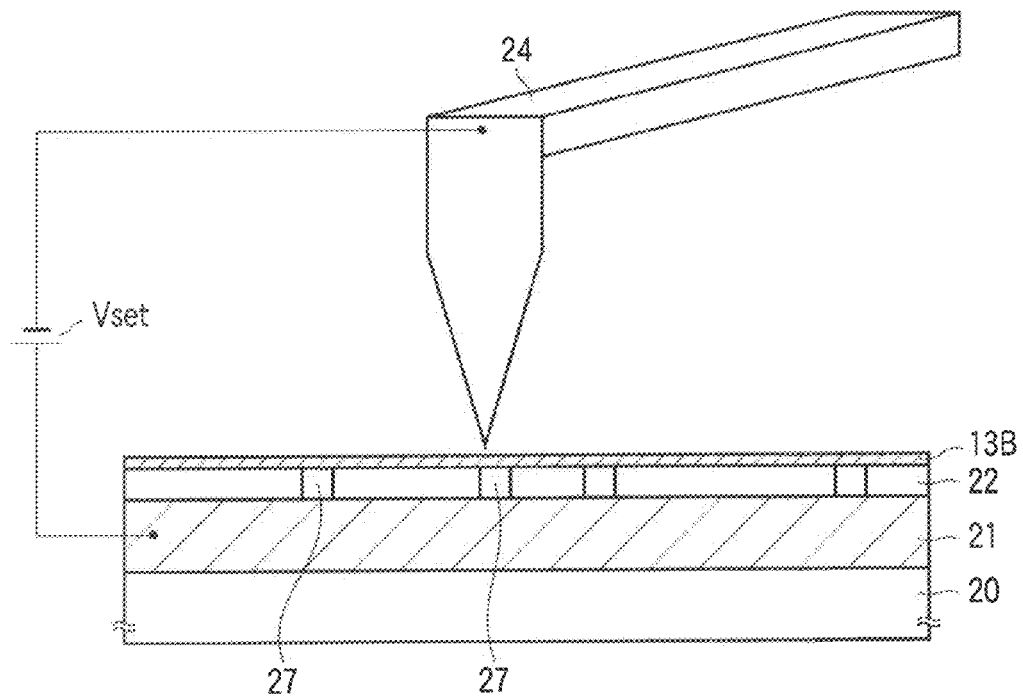
FIG. 6 is a view showing the condition of recording.

FIG. 6 shows a state at the time of recording (set operation).

The recording medium is comprised the electrode layer 21 on the substrate (for instance, semiconductor chip) 20, the recording layer 22 on the electrode layer 21, and the protection layer 13B on the recording layer 22. The protection layer 13B is comprised, for instance, a thin insulating material.

A recording operation is performed by generating the potential gradients in a recording bit 27 by applying a voltage to a surface of the recording bit 27 of the recording layer 22. Specifically, it is only necessary to supply a current/voltage pulse to the recording bit 27.

FIRST EXAMPLE

The materials of FIG. 1 are used for the recording layer in the first example.

Figure 7:
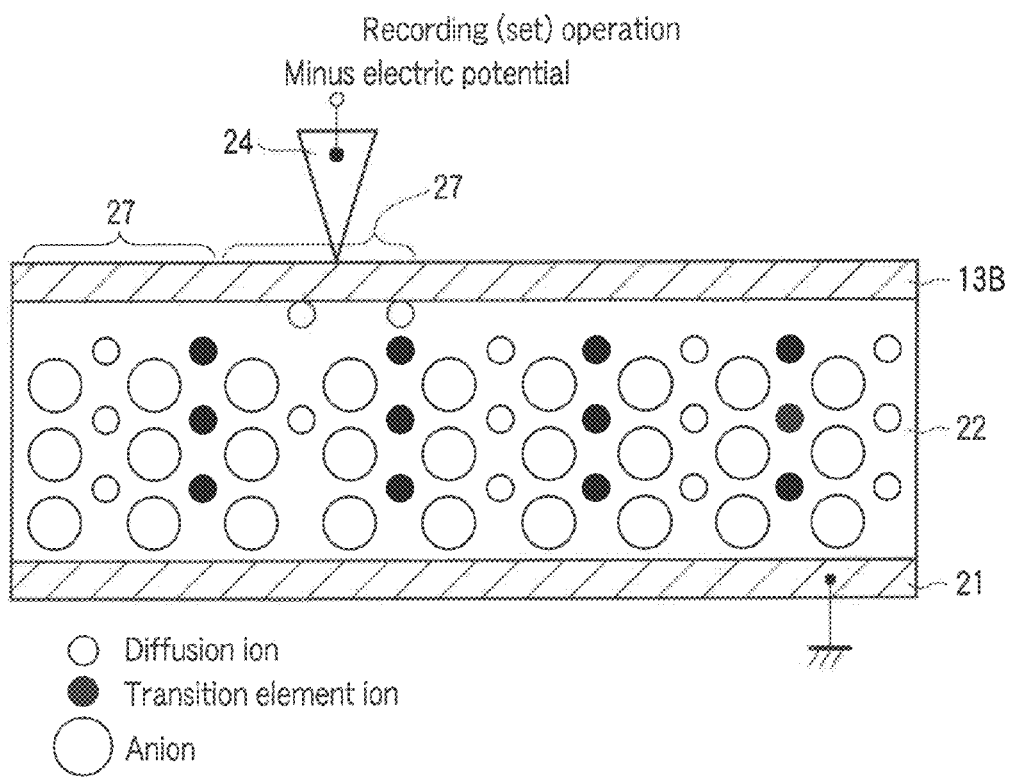
FIG. 7 is a view showing a write operation.

Firstly, as shown in FIG. 7, there is prepared a state where the electric potential of the probe 24 is relatively lower than the electric potential of the electrode layer 21. The probe 24 may be supplied with a negative electric potential, when the electrode layer 21 has a fixed electric potential, for instance, ground potential.

The current pulse is generated by emitting electrons toward the electrode layer 21 from the probe 24 while using, for instance, an electron generating source or hot electron source. Alternatively, it is also possible to bring the probe 24 into contact with the surface of the recording bit 27 to apply the voltage pulse.

At this time, for instance, in the recording bit 27 of the recording layer 22, part of diffusion ions moves to the probe (cathode) 24 side, and the number of cations inside the crystal relatively decreases in comparison to the number of anions. Further, diffusion ions moved to the probe 24 side separate out as the metal, while receiving electrons from the probe 24.

In the recording bit 27, the anions become excessive. As a result, a valence of diffusion ions in the recording bit 27 increases. That is, the recording bit 27 comes to have electron conductivity due to implantation of carrier by phase change, thereby decreasing the resistance in the thickness direction, and then the recording (set operation) is completed.

Similarly, the current pulse for recording can also be generated by preparing the state where the electric potential of the probe 24 is relatively higher than the electric potential of the electrode layer 21.

Figure 8:
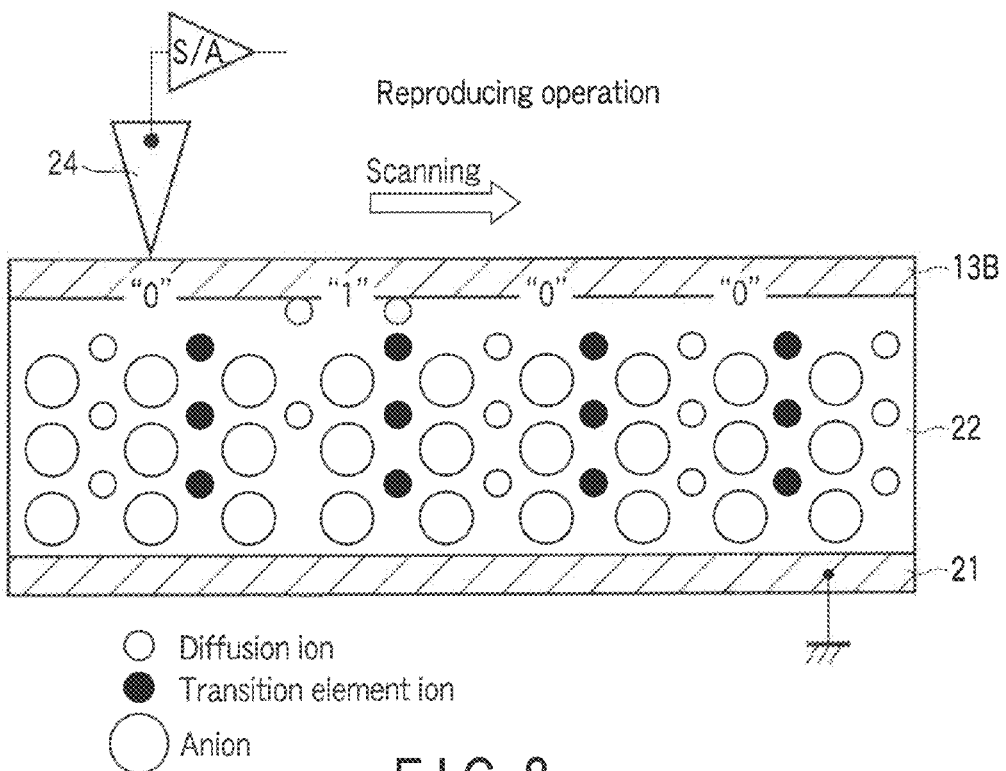
FIG. 8 is a view showing a read operation.

FIG. 8 shows the reproducing.

The reproducing is performed by causing the current pulse to flow through the recording bit 27 of the recording layer 22, followed by detecting the resistance value of the recording bit 27. However, the current pulse is set to a minute value to the degree that the material constituting the recording bit 27 of the recording layer 22 does not cause the resistance change.

For instance, a read current (current pulse) generated by a sense amplifier S/A is caused to flow through the recording bit 27 from the probe 24, and then, the resistance value of the recording bit 27 is measured by the sense amplifier S/A.

If the material according to the example of the present invention is used, it is possible to secure a difference of $10^3$ or more in the resistance value between the set/reset states.

Meanwhile, in the reproducing, continuous reproducing becomes possible by scanning the recording medium by the probe 24.

The erase (reset) operation is performed by promoting the oxidation-reduction reaction in the recording bit 27 in such a manner that the recording bit 27 of the recording layer 22 is subjected to joule heating based on the large-current pulse. Alternatively, it is also possible to apply the pulse providing potential of an inverse direction to the potential difference at the time of the set operation.

The erase operation can be performed in every recording bit 27, or can be performed on recording bits 27 or on a block unit.

SECOND EXAMPLE

The materials of FIG. 2 are used for the recording layer in the second example.

Figure 9:
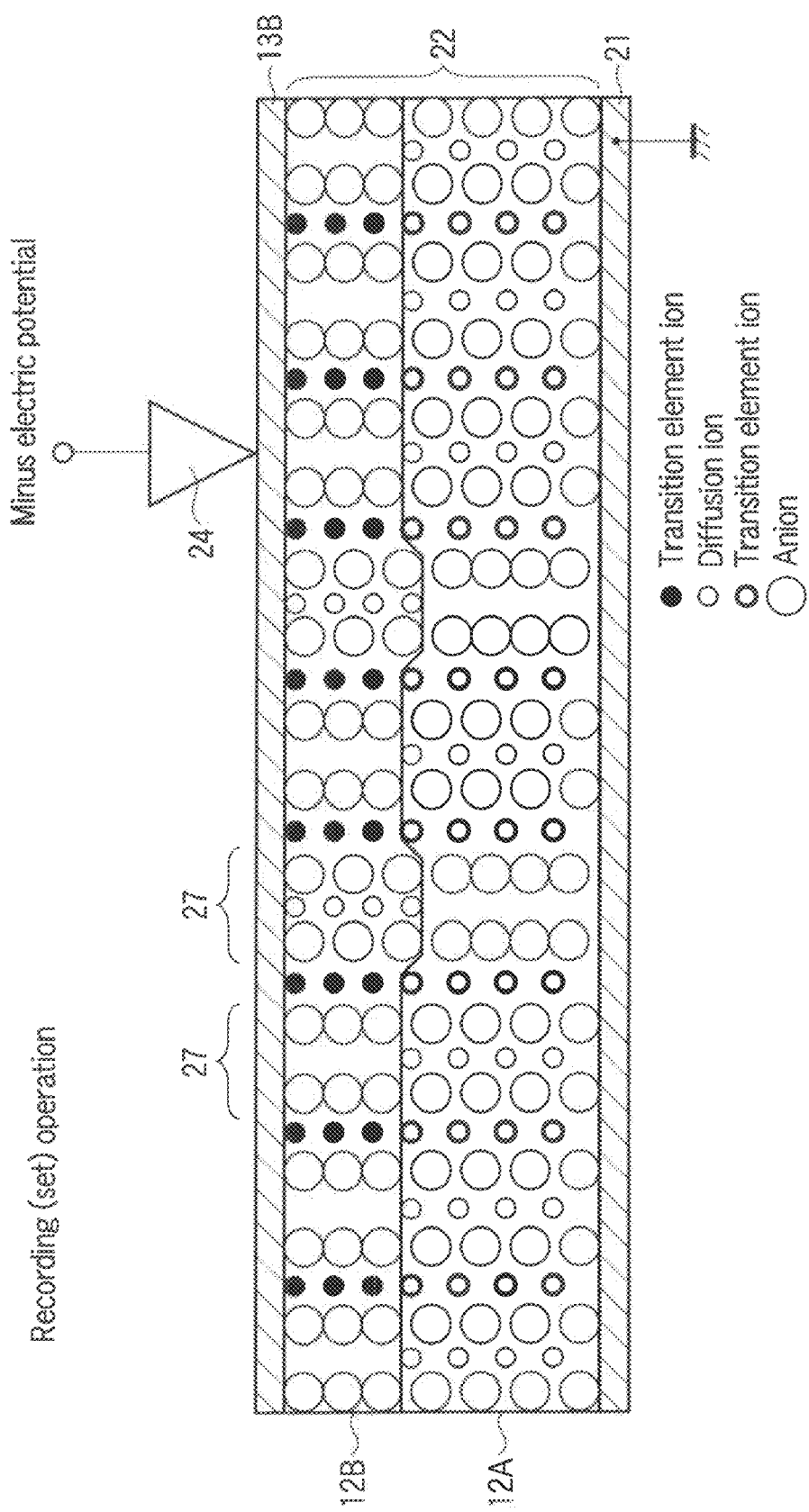
FIG. 9 is a view showing a write operation.

Firstly, as shown in FIG. 9, there is prepared a state where the electric potential of the probe 24 is relatively lower than the electric potential of the electrode layer 21. It is only necessary to supply a negative potential to the probe 24 when the electrode layer 21 has a fixed electric potential, for instance, ground potential.

At this time, part of diffusion ions inside the first chemical compound (anode side) 12A of the recording layer 22 can occupy in the vacant site of the second chemical compound (cathode side) 12B while moving inside the crystal. With this, the valence of diffusion ions inside the first chemical compound 12A increases, while the valence of transition element ions inside the second chemical compound 12B decreases. As a result, conductive carriers are generated inside the crystal of the first and second chemical compounds 12A, 12B, and then both come to have the electrical conductivity.

In this manner, the set operation (recording) is completed.

Meanwhile, concerning the recording operation, assuming that the position relation of the first and second chemical compounds 12A, 12B is reversed, it is also possible to execute the set operation while making the electric potential of the probe 24 relatively higher than the electric potential of the electrode layer 21.

Figure 10:
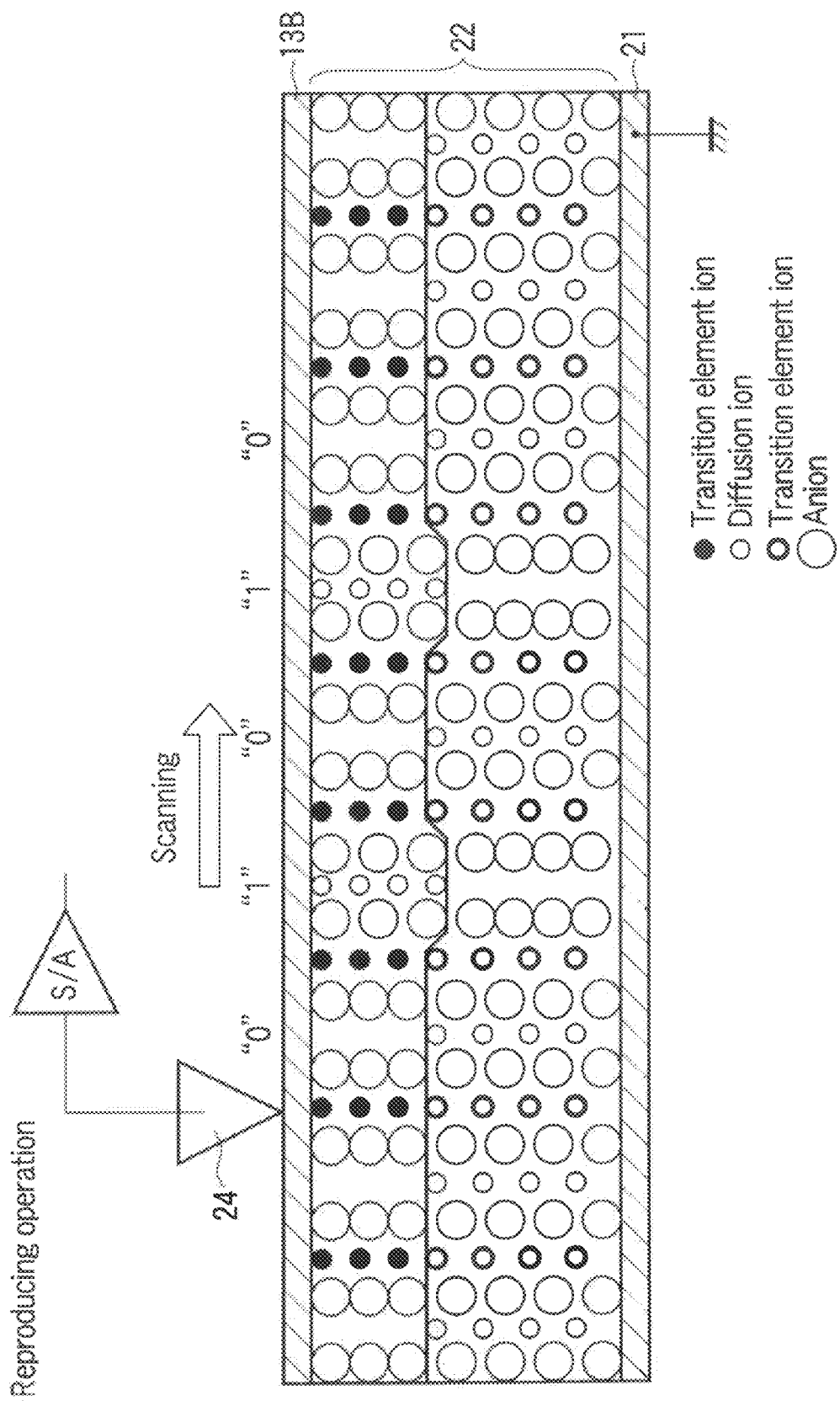
FIG. 10 is a view showing a read operation.

FIG. 10 shows a state at the time of the reproducing.

The reproducing operation is performed by causing the current pulse to flow through the recording bit 27, followed by detecting the resistance value of the recording bit 27. However, the current pulse needs to have a minute value to the degree that the material constituting the recording bit 27 does not cause the resistance change.

For instance, the read current (current pulse) generated by the sense amplifier S/A is caused to flow through the recording layer (recording bit) 22 from the probe 24, and then, the resistance value of the recording bit is measured by the sense amplifier S/A. When adopting the new materials described already, it is possible to secure a difference of $10^3$ or more in the resistance value between the set/reset states.

Meanwhile, the reproducing operation can be performed continuously by scanning the probe 24.

The reset (erase) operation may be performed by facilitating the action in which diffusion ions return to first chemical compound 12A from the vacant site inside the second chemical compound 12B while utilizing the joule heat and its residual heat generated by causing the large-current pulse to flow through the recording layer (recording bit) 22. Alternatively, it may be performed by applying the pulse providing the potential difference in an inverse direction to the potential difference at the time of the set operation.

The erase operation can be performed in every recording bit 27, or can be performed on recording bits 27 or on a block unit.

C. Summary

According to such probe memory, it is possible to realize a higher recording density and lower power consumption than those of the present hard disk or flash memory.

(2) Semiconductor Memory

A. Structure

Figure 11:
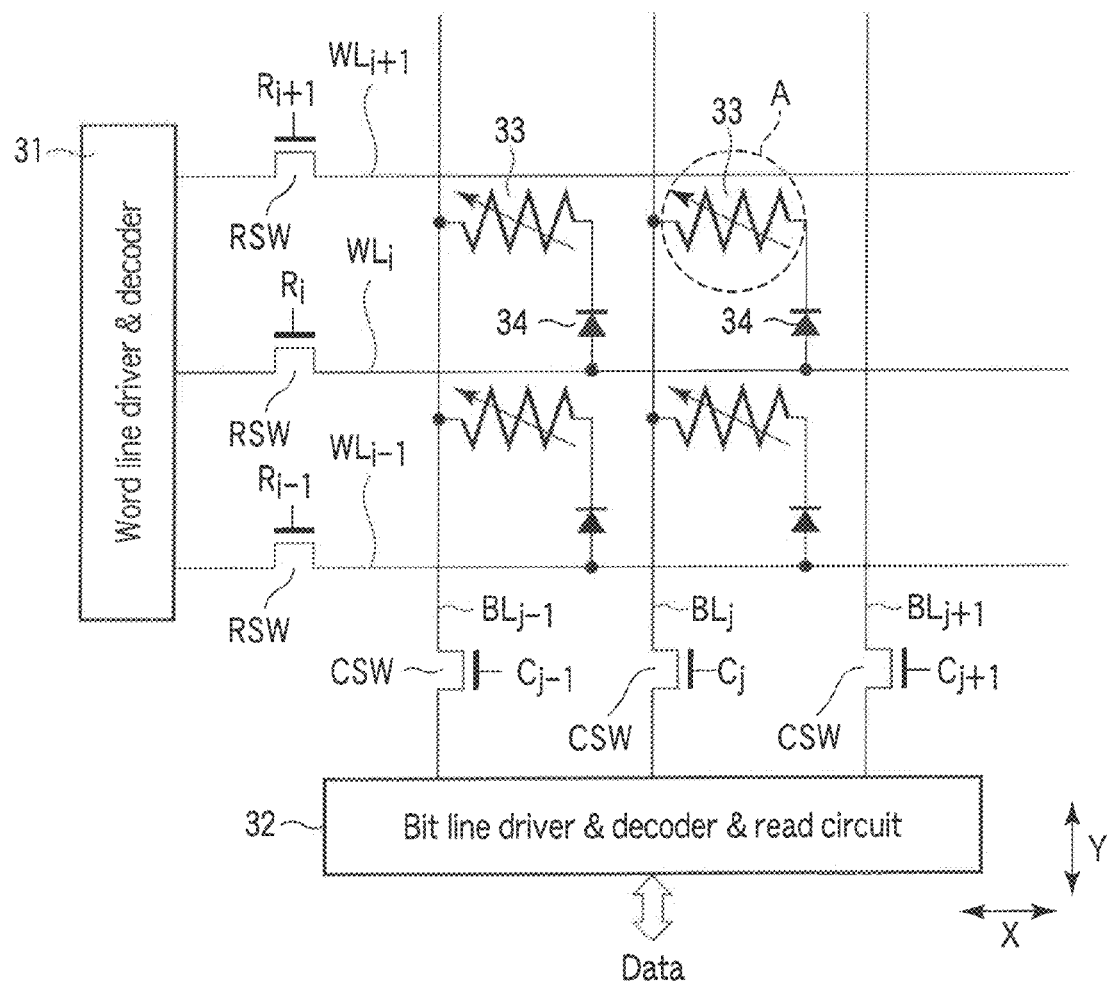
FIG. 11 is a view showing a semiconductor memory.

FIG. 11 shows a cross point type semiconductor memory according to an example.

Word lines WLi−1, WLi, and WLi+1 extend in diffusion direction, and bit lines BLj−1, BLj, and BLj+1 extend in the Y direction.

Each one end of the word lines WLi−1, WLi, and WLi+1 is connected to a word line driver & decoder 31 via a MOS transistor RSW as a selection switch, and each one end of the bit lines BLj−1, BLj, and BLj+1 is connected to a bit line driver & decoder & read circuit 32 via a MOS transistor CSW as a selection switch.

Selection signals Ri−1, Ri, and Ri+1 for selecting one word line (row) are input to a gate of the MOS transistor RSW, and selection signals Ci−1, Ci, and Ci+1 for selecting one bit line (column) are input to a gate of the MOS transistor CSW.

A memory cell 33 is arranged at each intersection part of the word lines WLi−1, WLi, and WLi+1 and the bit lines BLj−1, BLj, and BLj+1. The memory cell 33 has a so called cross point cell array structure.

A diode 34 for preventing a sneak current at the time of recording/reproducing is added to the memory cell 33.

Figure 12:
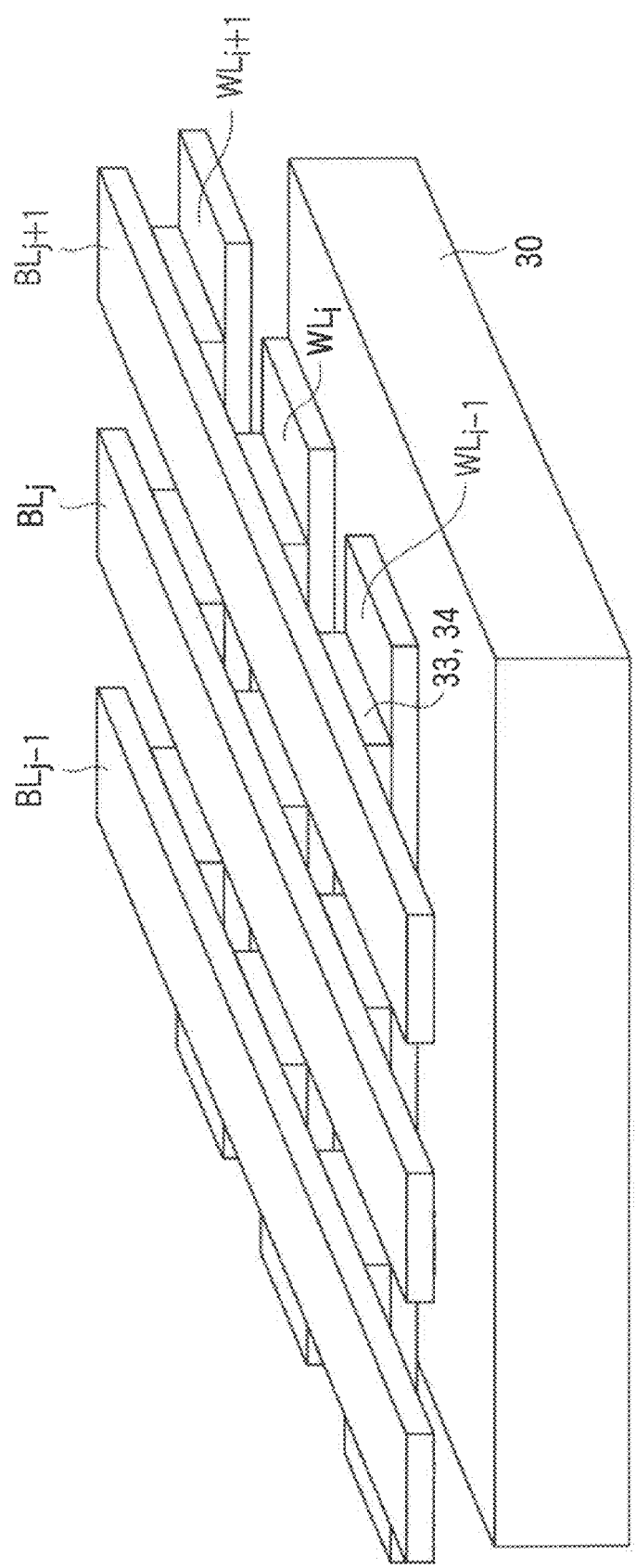
FIG. 12 is a view showing a memory cell array.

FIG. 12 shows a structure of a memory cell array part of the semiconductor memory of FIG. 11.

The word lines WLi−1, WLi, and WLi+1 and the bit lines BLj−1, BLj, and BLj+1 are arranged on a semiconductor chip 30, and the memory cells 33 and the diodes 34 are arranged in the intersection parts of these wirings.

Figure 14:
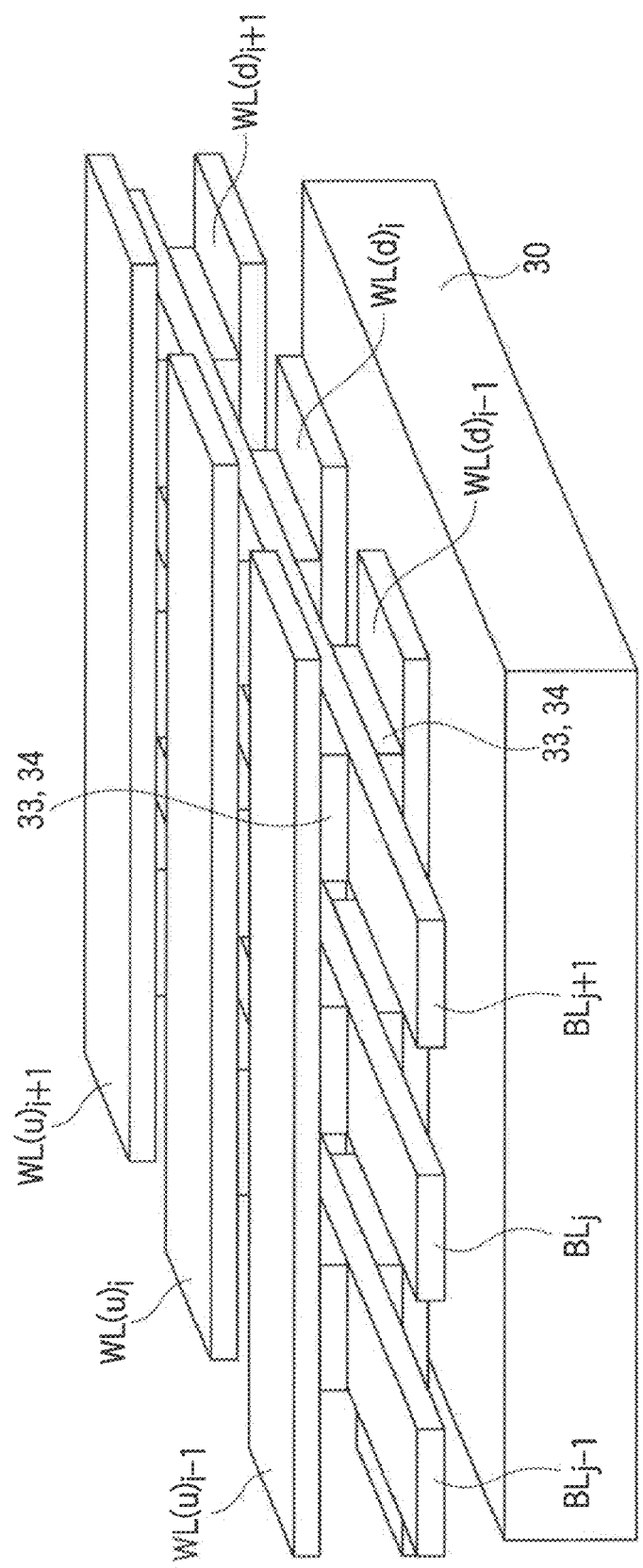
FIGS. 14 and 15 are views, each showing a memory cell array.
Figure 15:
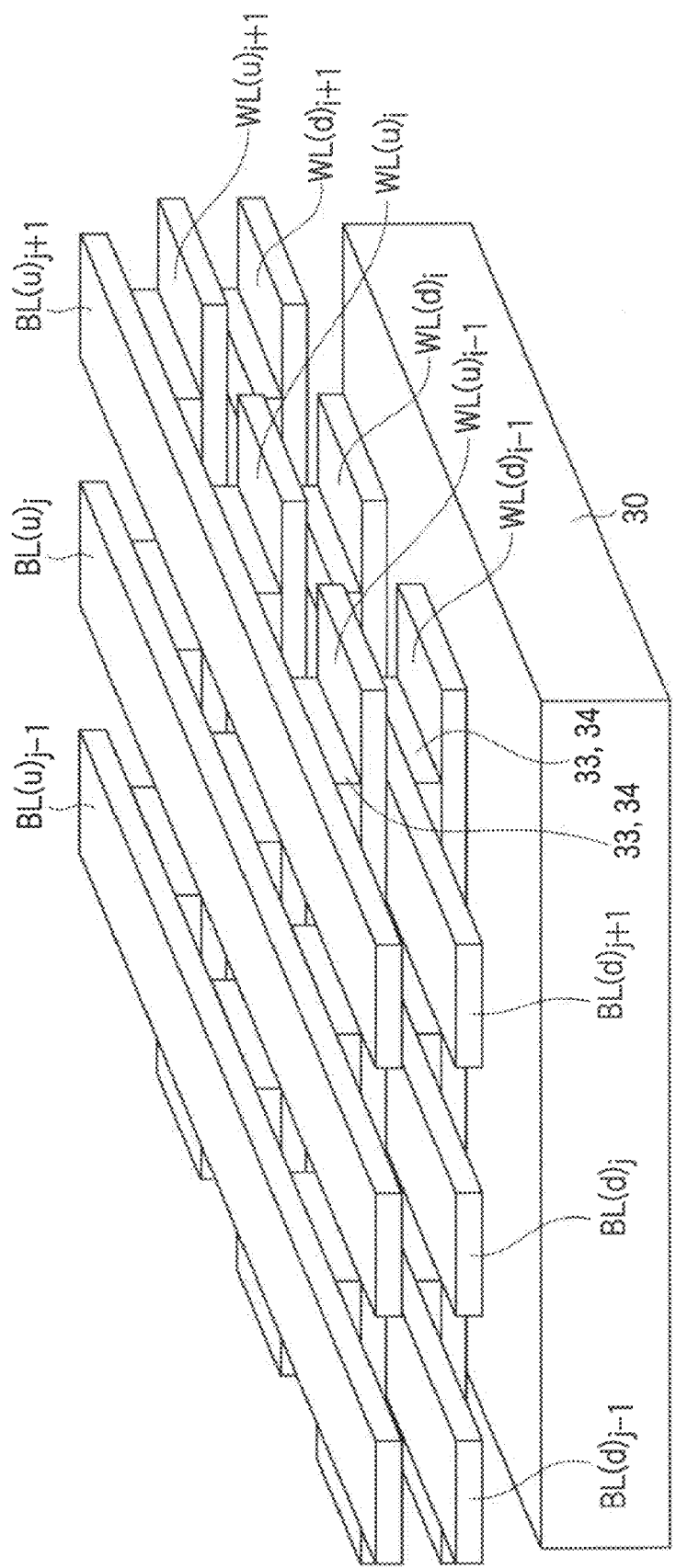

A feature of such a cross point type cell array structure lies in a point that, since it is not necessary to connect the MOS transistor individually to the memory cell 33, it is advantageous for high integration. For instance, as shown in FIGS. 14 and 15, it is possible to give the memory cell array a three-dimensional structure, by stacking the memory cells 33.

Figure 13:
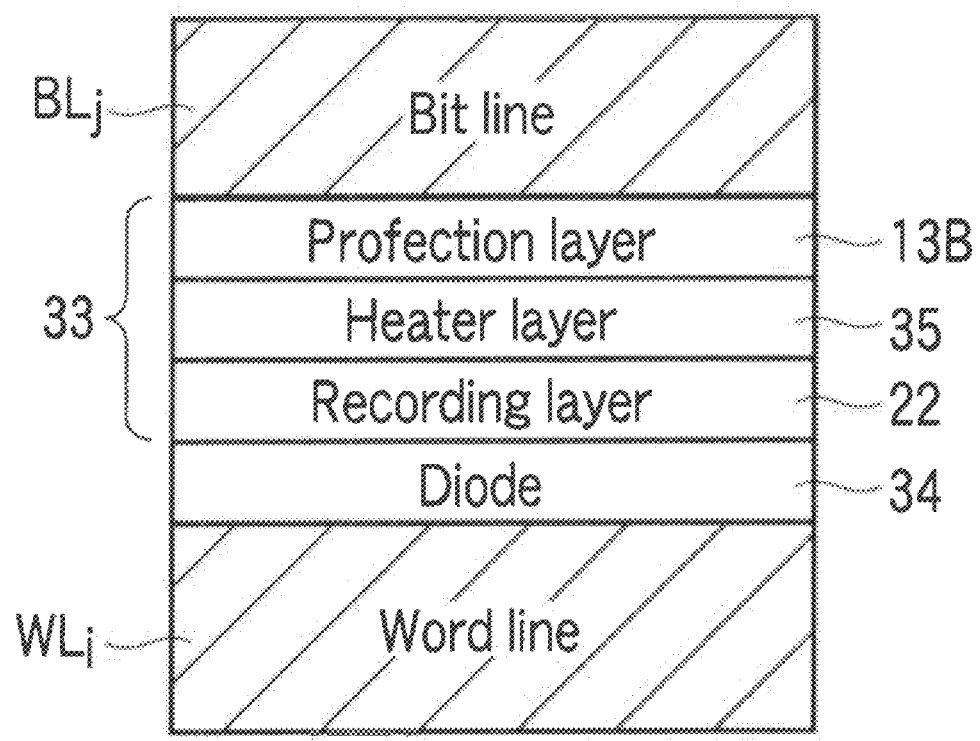
FIG. 13 is a view showing a memory cell.

For instance, as shown in FIG. 13, the memory cell 33 is comprised of a stack structure of a recording layer 22, a protection layer 13B and a heater layer 35. One bit data is stored in one memory cell 33. Further, the diode 34 is arranged between the word line WLi and the memory cell 33. Buffer layer may be provided between the word line WLi and the diode 34. Buffer layer may be provided between the bit line BLj and the protection layer 13B.

B. Recording/Reproducing Operation

A. recording/reproducing operation will be explained using FIGS. 11 to 13.

Here, it is assumed that the recording/reproducing operation is executed while selecting the memory cell 33 surrounded by dotted line A.

FIRST EXAMPLE

The materials of FIG. 1 are used for the recording layer in the first example.

Since it is adequate for the recording (set operation) to apply the voltage to the selected memory cell 33 followed by generating potential gradients inside the memory cell 33 to cause current pulses to flow therein, for instance, there is prepared a state where the electric potential of the word line WLi is relatively lower than the electric potential of the bit line BLj. It is only necessary to provide a negative potential to the word line WLi when the bit line BLj has the fixed potential, for instance, ground potential.

At this time, in the selected memory cell 33 surrounded by the dotted line A, part of diffusion ions moves to the word line (cathode) WLi side, and cations inside the crystal relatively decrease to anions. Further, diffusion ions having moved to the word line WLi side separate out as metal while receiving the electrons from the word line WLi.

In the selected memory cell 33 surrounded by the dotted line A, anions become excessive, and as a result, the valence of diffusion ions inside the crystal is caused to increase. That is, the selected memory cell 33 surrounded by the dotted line A comes to have larger electrical conductivity due to implantation of carriers caused by phase change, thereby completing the recording (set operation).

Similarly, at the time of recording, with respect to non selected word lines WLi−1, WLi+1, and non selected bit lines BLj−1, BLj+1, it is preferable that all are biased into the same electric potential.

Further, at the time of standby before recording, it is preferable for all of the word lines WLi−1, WLi, and WLi+1, and the bit lines BLj−1, BLj, and BLj+1, to become pre-charged.

Further, the current pulse for recording may be generated by preparing the state where the electric potential of the word line WLi is relatively higher than the electric potential of the bit line BLj.

The reproducing is performed by detecting a resistance value of the memory cell 33 while causing the current pulse to flow through the selected memory cell 33 surrounded by the dotted line A. However, it is necessary for the current pulse to be a minute value to the degree that the material constituting the memory cell 33 does not cause resistance changes.

For instance, the read current (current pulse) generated by a read circuit is caused to flow through the selected memory cell 33 surrounded by the dotted line A from the bit line BLj, and the resistance value of the memory cell 33 is measured by the read circuit. If adopting the new materials described above, the difference in the resistance value between the set/reset states can be secured at $10^3$ or more.

The erase (reset) operation is performed by facilitating the oxidation-reduction reaction in the memory cell 33 while performing joule heating of the selected memory cell 33 surrounded by the dotted line A by a large-current pulse.

SECOND EXAMPLE

The materials of FIG. 2 are used for the recording layer in the second example.

Since it is adequate for the recording (set operation) to apply the voltage to the selected memory cell 33 followed by generating potential gradients inside the memory cell 33 to cause current pulses to flow therein, for instance, there is prepared a state where the electric potential of the word line WLi is relatively lower than the electric potential of the bit line BLj. It is only necessary to provide a negative potential to the word line WLi when the bit line BLj has the fixed potential, for instance, ground potential.

At this time, in the selected memory cell 33 surrounded by the dotted line A, part of diffusion ions inside the first chemical compound moves to the vacant site of the second chemical compound. For this reason, the valence of transition element ions inside the first chemical compound increases, and the valence of transition element ions inside the second chemical compound decreases. As a result, the conductive carriers are generated inside the crystal of the first and second chemical compounds, and both come to have electrical conductivity.

Herewith, the set operation (recording) is completed.

Likewise, at the time of recording, with respect to non selected word lines WLi−1, WLi+1, and non selected bit lines BLj−1, BLj+1, it is preferable that all are biased with the same electric potential.

Further, at the time of standby before recording, it is preferable for all of the word lines WLi−1, WLi, and WLi+1, and the bit lines BLj−1, BLj, and BLj+1, to become pre-charged.

Further, the current pulse may be generated by preparing the state where the electric potential of the word line WLi is relatively higher than the electric potential of the bit line BLj.

The reproducing operation is performed by detecting the resistance value of the memory cell 33 while causing the current pulse to flow through the selected memory cell 33 surrounded by the dotted line A. However, it is necessary for the current pulse to be a minute value to the degree that the material constituting the memory cell 33 does not cause resistance changes.

For instance, the read current (current pulse) generated by the read circuit is caused to flow through the selected memory cell 33 surrounded by the dotted line A from the bit line BLj, and the resistance value of the memory cell 33 is measured by the read circuit. If adopting the new materials described above, the difference in the resistance value between the set/reset states can be secured at $10^3$ or more.

The reset (erase) operation may be performed by facilitating the action in which diffusion ion element returns to the first chemical compound from the vacant site inside the second chemical compound while utilizing the joule heat and its residual heat generated by causing the large-current pulse to flow through the selected memory cell 33 surrounded by the dotted line A.

Here, when the inside of the recording layer 22 formed at the intersection part of the word line WLi and the bit line BLj exists in a polycrystalline state or a monocrystalline state, it is preferable since diffusion of the ions inside the crystal easily occurs. However, also in this case, when the size of the crystal grain differs largely at respective memory cells, there is a possibility that the characteristic of the recording layer in respective memory cells varies. Therefore, it is preferable that in the respective memory cell, the size of crystal grain is approximately uniform, and that the distribution thereof follows the distribution having a single peak. In this case, it is assumed that the size of the crystal grain severed at an interface of each intersection part is not taken into consideration at the time distribution is obtained. In order to utilize movement of the diffusion ions inside the crystal structure, it is preferable that the size of the crystal grains in the recording film cross sectional direction is 3 nm or more, more preferably 5 nm or more. Assuming that the size of the intersection part becomes smaller than about 20 nm, it is preferable that the number of the crystal grains included in the respective intersection parts is 10 or less. Further, it is more preferable that the number of the crystal grains is 4 or less.

Next, there is considered the size of the crystal grain in the film thickness direction. In order that the resistance change is generated efficiently by the diffusion inside the crystal structure, it is preferable for the size in the film thickness direction of the crystal grain to be of the same degree or more as the film thickness. However, when layering no second chemical compound, the recording layer may have a minimal amorphous part at an upper part or lower part of the crystal part of the first chemical compound. This will be explained using FIGS. 29 and 30. As described using FIG. 1, ions separate out as A metal inside the recording layer, after being diffused via the diffusion path. At this time, when A ions separate out at an interface part of the first chemical compound being in the amorphous state while diffusing to an end part of crystal grain of the first chemical compound, it is preferable because there is the vacancy to be occupied by A ions. However, when the film thickness t1 of the layer being in the amorphous state becomes excessively large, the recording layer as a whole does not cause the resistance change efficiently. Generally, the resistance of the amorphous part takes a value between a resistance of the first chemical compound having an insulating state and a resistance of the first chemical compound having a conductive state. Since the resistance change of the amorphous layer due to movement of A ions is not large, in order that the resistance change of the recording film is made more than an order of magnitude, it is preferable for the film thickness t1 of the amorphous layer to be $1/10$ or less of t2.

The amorphous layer may exist on either the upper part or lower part of the first chemical compound. However, in order to orient the first chemical compound in a required direction, generally, orientation control is performed by using a lower layer which agrees with the first chemical compound in lattice constant, and therefore, it is preferable for the amorphous part to exist on the upper part of the first chemical compound.

Further, the amorphous layer may be generated at the time a next layer contacting the recording layer is formed. In such a case, the composition of the amorphous layer, which is different from the composition inside the first chemical compound, includes part of the materials of the next layer contacting the recording layer, and the amorphous layer has an effect of enhancing the adhesion property between the recording film material and the next layer. In this case, film thickness t1 of the amorphous layer becomes 10 nm or less. It is more preferable for t1 to be 3 nm or less.

Continuously, there is considered the interface of the respective interconnection parts. When the recording layer is subjected to a process in which the recording layer is fabricated in the same shape as the word line after forming the recording layer uniformly, there is a possibility that the characteristic of the fabricated face of the recording layer is different from that inside the crystal. As a method for avoiding this influence, there is a method in which a uniform recording layer is used without processing, by using the recording layer to become an insulator at the time of film formation. As shown in FIG. 27, it is only necessary that the recording layer is formed on the word lines and the insulator, when a space between the word lines is embedded with materials having an insulating property. Alternatively, as shown in FIG. 28, the recording layer may be formed on the word line and on the substrate, when the recording film material functions as an insulator of the space between the word lines. Thus, it is possible to form arbitrary films before forming the recording layer. In FIGS. 27 and 28, there is shown an example in which a buffer layer is formed to suppress diffusion of the recording layer material before the recording layer is formed. The buffer layer may be provided all over the lower part of the recording layer material in advance, when the buffer layer is made of the insulator. In FIGS. 27 and 28, the recording film is uniform is shown. However, similarly, it is possible to alleviate the influence of a processed face, when the recording layer is processed only in the direction of the bit line or the word line, or when the recording layer is processed to be larger than the respective intersection points.

C. Summary

According to such semiconductor memory, a higher recording density and lower power consumption than those of the existing hard disk or flash memory can be realized.

(3) Others

Although the probe memory and the semiconductor memory are described in the examples, the materials and principles proposed in the examples of the invention can also be applied to a recording medium such as a current hard disk.

4. Method for Manufacturing the Recording Medium

A method for manufacturing the recording medium of the example of the invention will be described below.

(1) The structure of the recording medium of FIG. 6 is described by way of example.

It is assumed that the substrate 20 is a glass disk having the diameter of about 60 mm and the thickness of about 1 mm. Platinum (Pt) is evaporated on the substrate 20 to form the electrode layer 21 having the thickness of about 500 nm.

Using a target in which a composition is adjusted such that $ZnV_2O_4$ is deposited, RF magnetron sputtering is performed at a temperature of 300 to 600° C. in the atmosphere of argon (Ar) 95% and oxygen ($O_2$) 5% to form $ZnV_2O_4$ having the thickness of about 10 nm on the electrode layer 21. $ZnV_2O_4$ comprises a part of the recording layer 22.

$TiO_2$ having the thickness of about 3 nm is formed on $ZnV_2O_4$ by the RF magnetron sputtering. As a result, the recording layer 22 has the laminated structure of $ZnV_2O_4$ and $TiO_2$.

Finally the protection layer 13B is formed on the recording layer 22 to complete the recording medium of FIG. 6.

(2) The structure of the recording medium of FIG. 12 is described by way of example.

After the Si substrate protected by the thermally-oxidized film is planarized, for example, by CMP, a layer made of a conductive material is deposited on the Si substrate. A metallic material such as W, Ta, Al, or Cu, or an alloy, metal silicide, or nitride such as TiN and WC, or carbide is used as the conductive material. A highly-doped silicon layer may also be used as the conductive material.

A semiconductor layer made of Si, Ge, GaAs or the like is provided in order to form a diode. Typically the semiconductor layer includes a polysilicon layer of Si. Alternatively the semiconductor layer may include an amorphous layer. Typically, after a highly-doped semiconductor layer (for example, p-type) is provided, a semiconductor layer in which a dopant having the reverse property (for example, n-type) is doped at a low level is provided to form a diode layer.

Then, as necessary, a highly-doped semiconductor layer having the reversed property (for example, n-type) may be provided in order to decrease an interfacial resistance and a metal silicide layer may be provided in order to reset a crystalline influence of the diode layer. Alternatively, a buffer layer may be provided in order to control the orientation of the recording layer as necessary.

The case in which a TiN layer is provided as the buffer layer will be described by way of example. It is well known that TiN orientated toward the (100) direction is easily obtained and the TiN layer having the large crystal grain of about 20 nm is easily obtained when the TiN layer is deposited with low power. Therefore, in the manufacturing method of the example, the TiN layer deposited with low power is inserted as the buffer layer.

Then the recording layer ($ZnV_2O_4$ layer) having the spinel structure is deposited. As described above, using the target in which the composition is adjusted such that $ZnV_2O_4$ is deposited, the RF magnetron sputtering is performed at the temperature of 300 to 600° C. in the atmosphere of argon (Ar) 95% and oxygen ($O_2$) 5% to form $ZnV_2O_4$ having the thickness of about 10 nm. When the buffer layer having the large crystal grain is provided while a ratio of the lattice constant of the buffer layer and the lattice constant of the first chemical compound is close to an integer, the orientated first chemical compound having the large crystal grain is easy to obtain. Because the lattice constant ratio of the (100)-orientated TiN and the (100)-orientated spinel structure substantially becomes an integer, the (100)-orientated spinel structure is easily obtained on the (100)-orientated TiN buffer layer. Generally it is well known that the crystal grain size of the buffer layer is substantially equal to the crystal grain size of the first chemical compound.

For example, $SnO_2$ is deposited as the protection layer.

A mask process and a first etching process are performed subsequent to the film deposition processes to obtain sheet-like structures arrayed in parallel.

The space of the sheet-like structure is filled with the insulating material, and the conductive layer which comprises the upper electrode is deposited after a planarization process. A mask process and a second etching process are performed to process the sheet-like structures in a direction orthogonal to the first etching process. Then, the space portion is filled with the insulating material, and the planarization process is performed, which allows the memory of FIG. 12 to be obtained.

As described above with reference to the manufacturing method, when the first chemical compound which comprises the recording layer is deposited on the underlying layer having the large crystal grain, preferably the first chemical compound layer having the large grain size is easily obtained. At this point, preferably the underlying layer is made of a material having good adhesion to the first chemical compound layer. When the lattice constant ratio of the underlying layer and the recording layer comes close to an integer, preferably not only the orientation of the recording layer can be controlled, but also the large crystal grain of the recording layer can be retained.

5. EXPERIMENTAL EXAMPLE

Experimental examples in which some samples are prepared to evaluate a resistance ratio of the reset state (erasing state) and the set state (writing state) will be described.

The recording medium having the structure of FIG. 6 is used as the sample.

A probe pair in which a diameter of a leading end is steepled to 10 nm or less is used in the evaluation.

One of the probes is brought into contact with the protection layer 13B and grounded. The other probe is brought into contact with the lower electrode layer 21 to perform the writing/erasing. For example, the writing is performed by applying the pulse having the voltage of 1V and the width of 10 ns to the recording layer 22. For example, the erasing is performed by applying the pulse having the voltage of 0.2V and the width of 100 ns to the recording layer 22.

For example, the reading is performed using the probe pair between the writing and the erasing. In the reading, the pulse having the voltage of 0.1V and the width of 10 ns is applied to the recording layer 22 to measure the resistance of the recording layer (recording bit) 22.

(1) First Experimental Example

The sample of a first experimental example is prepared as follows.

The electrode layer 21 includes the Pt film which is formed on the disk, and the Pt film has the thickness of about 500 nm. The recording layer 22 is made of $ZnV_2O_4$, and the protection layer 13B is made of diamond-like carbon (DLC).

$ZnV_2O_4$ having the thickness of about 10 nm is formed on the disk by, for example, performing the RF magnetron sputtering in the atmosphere of 95% of Ar and 5% of $O_2$ while the disk is maintained at the temperature range of 300 to 600° C. The diamond-like carbon having the thickness of about 3 nm is formed on $ZnV_2O_4$ by, for example, the CVD method.

The resistance after the writing becomes of the order of $10^5\Omega$, and the resistance after the erasing becomes of the order of $10^8\Omega$. The resistance ratio of the both is about $10^3$, and it is confirmed that a sufficient margin can be secured in the reading.

(2) Second Experimental Example

In the second experimental example, the same sample as the first experimental example is used except that the recording layer is made of $ZnTi_2O_4$.

As with the first experimental example, the resistances after the writing/erasing become of the order of $10^7\Omega/10^3\Omega$. The resistance ratio of the both is about $10^4$, and it is confirmed that the sufficient margin can be secured in the reading.

(3) Third Experimental Example

In the third experimental example, the same sample as the first experimental example is used except that the recording layer is made of $Zn_2VO_4$ and the protection layer 13B is made of $SnO_2$.

As with the first experimental example, the resistances after the writing/erasing become of the order of $10^2\Omega/10^5\Omega$. The resistance ratio of the both is about $10^2$, and it is confirmed that the sufficient margin can be secured in the reading.

(4) Fourth Experimental Example

In the fourth experimental example, the same sample as the third experimental example is used except that the recording layer is formed by the laminated structure of $Zn_{0.5}V_2O_4$ and Zn. $Zn_{0.5}V_2O_4$ is formed by a sputtering method and Zn is formed with the thickness of about 10 nm.

While the resistance in the initial state is of the order of $10^7\Omega$, the resistance after the writing becomes of the order of $10^5\Omega$, and the resistance after the erasing becomes of the order of $10^8\Omega$. The resistance ratio of the writing/erasing is about $10^3$, and it is confirmed that the sufficient margin can be secured in the reading.

Then the evaluation is performed by pulse erasing. The probe pair in which the diameter of the leading end is steepled to 10 nm or less is used in the evaluation.

One of the probes is brought into contact with the protection layer 13B and grounded. The other probe is brought into contact with the lower electrode layer 21 to perform the writing/erasing. For example, the writing is performed by applying the pulse having the voltage of 3V and the width of 10 ns to the recording layer 22. For example, the erasing is performed by applying the pulse having the voltage of −3V and the width of 10 ns to the recording layer 22.

For example, the reading is performed using the probe pair between the writing and the erasing. In the reading, the pulse having the voltage of 0.1V and the width of 10 ns is applied to the recording layer 22 to measure the resistance of the recording layer (recording bit) 22.

(5) Fifth Experimental Example

The recording medium having the structure of FIG. 6 is used as the sample of the fifth experimental example. In the fifth experimental example, the same sample as the first experimental example is used.

As with the first experimental example, the resistances after the writing/erasing become of the order of $10^5\Omega/10^8\Omega$. The resistance ratio of the both is about $10^3$, and it is confirmed that the sufficient margin can be secured in the reading.

(6) Sixth Experimental Example

In the sixth experimental example, the same sample as the fifth experimental example is used except that the recording layer is made of $Zn_{1.5}V_{1.5}O_4$.

The resistances after the writing/erasing become of the order of $10^3\Omega/10^6\Omega$. The resistance ratio of the both is about $10^3$, and it is confirmed that the sufficient margin can be secured in the reading.

(7) Seventh Experimental Example

In the seventh experimental example, the same sample as the fifth experimental example is used except that the (100)-orientated VN is used as the electrode layer 21 and the recording layer is made of $ZnV_2O_4$. Using the target in which the composition is adjusted such that VN is deposited, VN having the film thickness of 100 nm is deposited at room temperature in the argon atmosphere by the RF magnetron sputtering. When VN is used instead of Pt as the lower electrode, $ZnV_2O_4$ orientated toward the a-axis can be obtained because of consistency of the lattice constant.

The resistances after the writing/erasing become of the order of $10^4\Omega/10^8\Omega$. The resistance ratio of the both is about $10^4$, and it is confirmed that the sufficient margin can be secured in the reading.

(8) Eighth Experimental Example

The recording medium having the structure of FIG. 6 is used as the sample of the eighth experimental example. In the eighth experimental example, the recording layer 22 is formed by the laminated structure of the first chemical compound and the second chemical compound. The first chemical compound having the thickness of 10 nm is made of $ZnV_2O_4$, and the second chemical compound having the thickness of 3 nm is made of $TiO_2$. The protection layer is made of $SnO_2$.

The resistances after the writing/erasing become of the order of $10^6\Omega/10^{10}\Omega$. The resistance ratio of the both is about $10^4$, and it is confirmed that the sufficient margin can be secured in the reading.

(9) Comparative Example

In the comparative example, the same sample as the fifth experimental example is used except that the recording layer is made of MgO.

In the comparative example, the writing/erasing cannot be performed when the pulse having the voltage of 1V and the width of 10 ns is applied to the recording layer 22 like the first experimental example. Therefore, the pulse having the voltage of 20V and the width of 10 ns is applied to perform the writing, and the pulse having the voltage of −3V and the width of 1 μs is applied to perform the erasing. The resistances after the writing/erasing become of the order of $10^5\Omega/10^{13}\Omega$. When MgO having the NaCl structure is used as the recording layer, disadvantageously the large voltage is necessary to perform the writing/erasing because the cation hardly diffuses.

(10) Summary

As described above, in all of the samples of the first to eighth experimental examples, the basic operations of the writing, the erasing, and the reading can be performed.

6. Application to a Flash Memory (1) Structure

The example of the present invention can also be applied to the flash memory.

FIG. 16 shows a memory cell of the flash memory.

The memory cell of the flash memory is comprised a MIS (metal-insulator-semiconductor) transistor.

A diffusion layer 42 is formed in a surface region of a semiconductor substrate 41. A gate insulating layer 43 is formed on a channel region between the diffusion layers 42. A recording layer (ReRAM: Resistive RAM) 44 according to an example of the present invention is formed on the gate insulating layer 43. A control gate electrode 45 is formed on the recording layer 44.

The semiconductor substrate 41 may be a well region, and the semiconductor substrate 41 and the diffusion layer 42 have reverse conductivity types mutually. The control gate electrode 45 becomes the word line, and is comprised a conductive polysilicon.

The recording layer 44 is comprised the materials shown in FIG. 1, 2 or 3.

(2) Fundamental Operation

Explanation will now be made about the fundamental operation using FIG. 16.

A set (write) operation is executed by providing an electric potential V1 to the control gate electrode 45, and providing an electric potential V2 to the semiconductor substrate 41.

The difference between the electric potentials V1, V2 needs to be sufficiently large for the recording layer 44 to cause a phase change or a resistance change, but its direction is not limited particularly.

That is, either V1>V2 or V1<V2 may be applied.

For instance, in an initial state (reset state), assuming that the recording layer 44 is an insulator (resistance is large), the gate insulating layer 43 becomes quite thick. As a result, a threshold of the memory cell (MIS transistor) becomes high.

When the recording layer 44 is caused to change into a conductor (resistance is small) while providing the electric potentials V1, V2 from this state, the gate insulating layer 43 becomes quite thin. As a result, a threshold of the memory cell (MIS transistor) becomes low.

Note that, although the electric potential V2 is supplied to the semiconductor substrate 41, the electric potential V2 may be instead transferred to the channel region of the memory cell from the diffusion layer 42.

The reset (erase) operation is executed in such a manner that the electric potential V1' is supplied to the control gate electrode 45, the electric potential V3 is supplied to one of the diffusion layers 42, and the electric potential V4 (<V3) is supplied to the other one of the diffusion layers 42.

The electric potential V1' is set to a value exceeding the threshold of the memory cell being in the set state.

At this time, the memory cell becomes ON, the electrons flow toward one direction from the other direction of the diffusion layer 42, and hot electrons are generated. Since the hot electrons are implanted into the recording layer 44 via the gate insulating layer 43, the temperature of the recording layer 44 increases.

Herewith, since the recording layer 44 changes to the insulator (resistance is large) from the conductor (resistance is small), the gate insulating layer 43 becomes quite thick. Accordingly, the threshold of the memory cell (MIS transistor) becomes high.

In this manner, by a similar principle to the flash memory, the threshold of the memory cell can be changed, and therefore, it is possible to put the information recording/reproducing device according to the example of the present invention into practical use, while utilizing the technique of the flash memory.

(3) NAND Type Flash Memory

Figure 17:
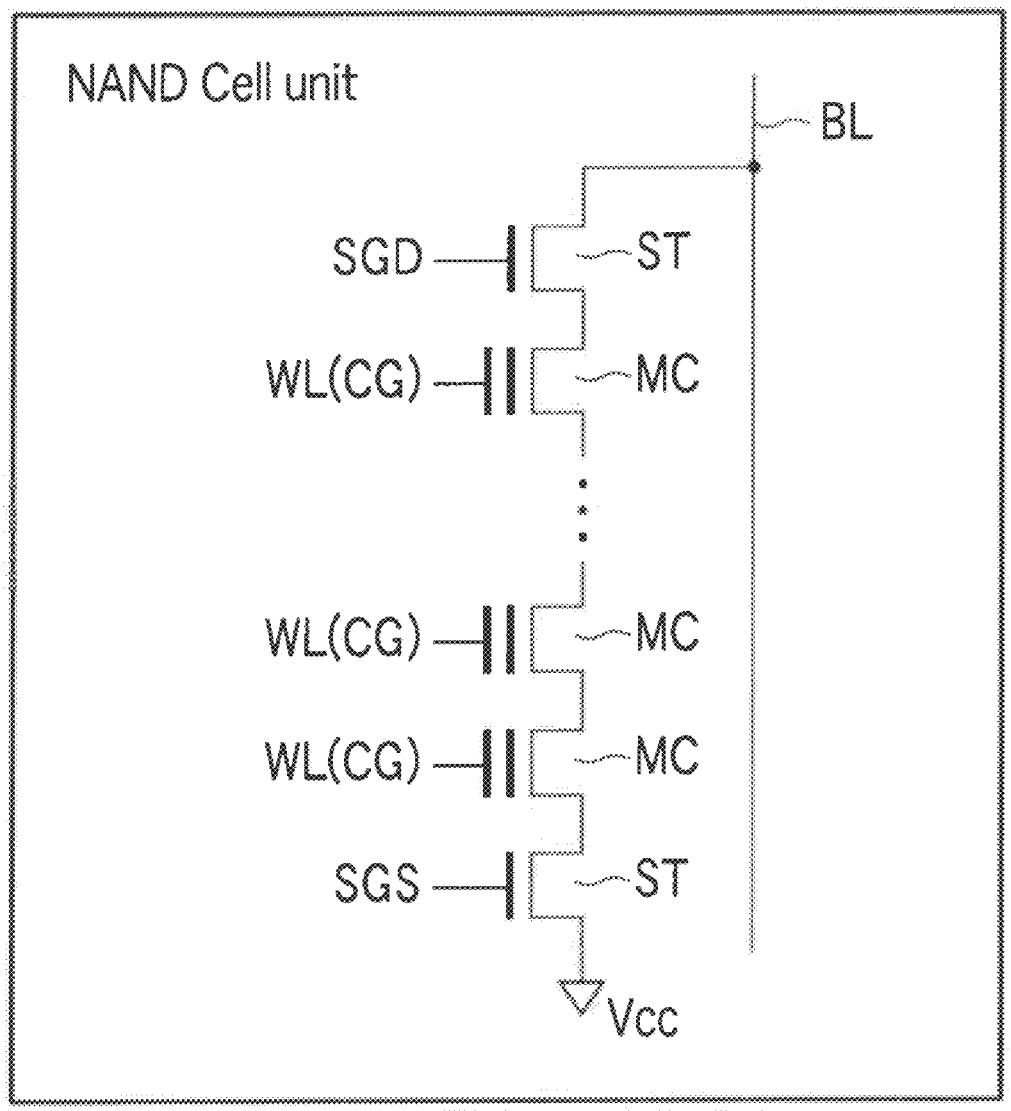

FIG. 17 shows a circuit diagram of a NAND cell unit. FIG. 18 shows a structure of the NAND cell unit according to the example.

An N-type well region 41b and a P-type well region 41c are formed inside a P-type semiconductor substrate 41a. A NAND cell unit according to the example of the present invention is formed inside the P-type well region 41c.

The NAND cell unit is comprised of a NAND string comprised memory cells MC connected in series, and a total of two select gate transistors ST connected one by one to the both ends of the NAND string.

The memory cell MC and the select gate transistor ST have the same structure. Specifically, these are comprised an N-type diffusion layer 42, a gate insulating layer 43 on the channel region between the N-type diffusion layers 42, a recording layer (ReRAM) 44 on the gate insulating layer 43, and a control gate electrode 45 on the recording layer 44.

States (insulator/conductor) of the recording layer 44 of the memory cell MC can be changed by the above-described fundamental operation. On the other hand, the recording layer 44 of the select gate transistor ST is fixed to the set state, that is, the conductor (resistance is small).

One of the select gate transistors ST is connected to a source line SL, and the other one is connected to a bit line BL.

Before set (write) operation, it is assumed that all memory cells inside the NAND cell unit are in the reset state (resistance is large).

The set (write) operations are performed one by one in order toward the memory cell at the bit line BL side from the memory cell MC at the source line SL side.

V1 (plus potential) is supplied as the write potential to the selected word line (control gate electrode) WL, and $V_{pass}$ is supplied as a transfer potential (electric potential by which memory cell MC becomes ON) to the non selected word line WL.

Program data is transferred to the channel region of the selected memory cell MC from the bit line BL, in the state that the select gate transistor ST at the source line SL side is made OFF, and the select gate transistor ST at the bit line BL side is made ON.

For instance, when the program data is "1", a write inhibit potential (for instance, electric potential being the same degree as V1) is transferred to the channel region of the selected memory cell MC, so that the resistance value of the recording layer 44 of the selected memory cell MC does not change into the low state from the high state.

Further, when the program data is "0", V2 (<V1) is transferred to the channel region of the selected memory cell MC, and the resistance value of the recording layer 44 of the selected memory cell MC is changed into the low state from the high state.

In the reset (erase) operation, for instance, V1' is supplied to all the word lines (control gate electrode) WL to make all the memory cells MC inside the NAND cell unit ON. Further, the two select gate transistors ST are turned ON, V3 is supplied to the bit line BL, and V4 (<V3) is supplied to the source line SL.

At this time, since the hot electrons are implanted to the recording layer 44 of all the memory cells MC inside the NAND cell unit, the reset operation is collectively executed to all memory cells MC inside the NAND cell unit.

The read operation is performed in such a manner that a read potential (plus potential) is supplied to the selected word line (control gate electrode) WL, and electric potentials by which the memory cell MC becomes inevitably ON regardless of the data "0", "1" are supplied to the non selected word line (control gate electrode) WL.

Further, the two select gate transistors ST are turned ON, and the read current is supplied to the NAND string.

Since the selected memory cell MC, when applied with the read potential, becomes ON or OFF in accordance with data value stored therein, it is possible to read the data by, for instance, detecting changes of the read current.

Figure 19:
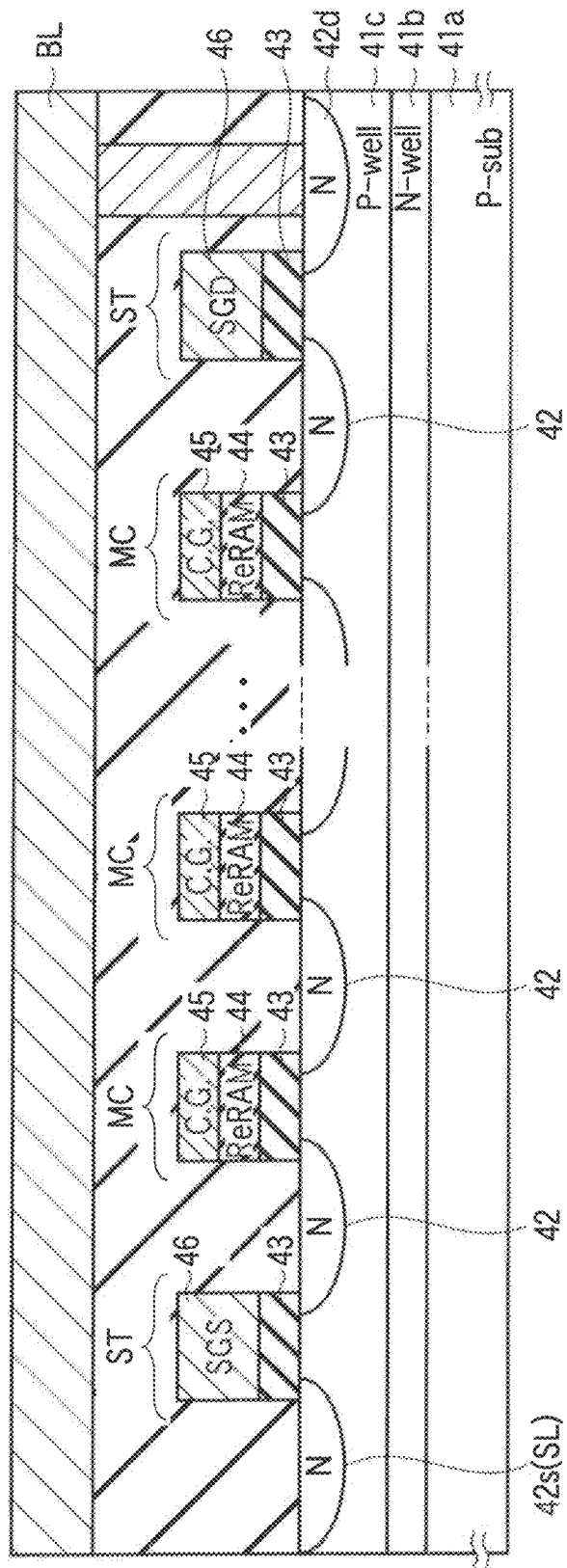

In the structure of FIG. 18, the select gate transistor ST has the same structure as the memory cell MC. However, for instance, as shown in FIG. 19, the select gate transistor ST may be a normal MIS transistor without forming the recording layer.

Figure 20:
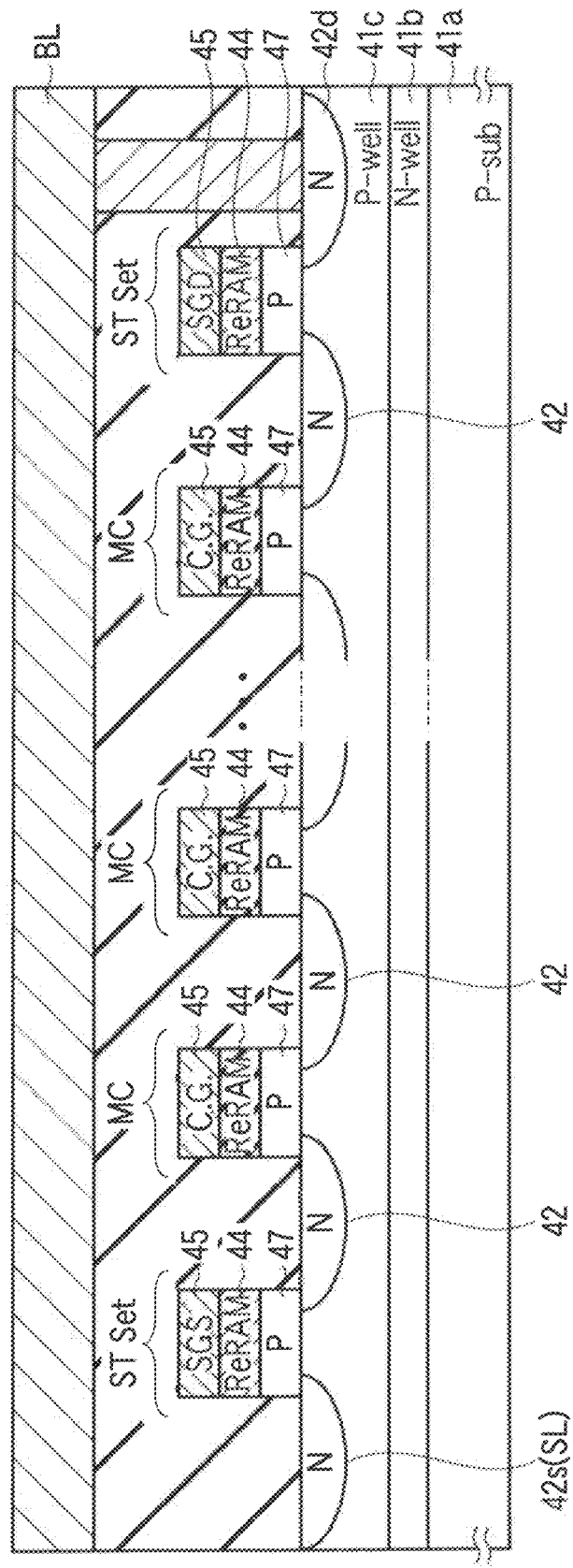

FIG. 20 shows a modified example of the NAND type flash memory.

The modified example is characterized in that the gate insulating layer of memory cells MC constituting the NAND string is replaced with a P-type semiconductor layer 47.

When high integration is advanced and the memory cell MC is miniaturized, in a state where the voltage is not supplied, the P-type semiconductor layer 47 is filled with a depletion layer.

At the time of set (write), a plus write potential (for instance, 3.5V) is supplied to the control gate electrode 45 of the selected memory cell MC, and a plus transfer potential (for instance, 1V) is supplied to the control gate electrode 45 of the non selected memory cell MC.

At this time, a surface of the P-type well region 41c of memory cells MC inside the NAND string inverts from P-type to N-type, so that a channel is formed.

Consequently, as described above, when the select gate transistor ST at the bit line BL side is turned ON, and the program data "0" is transferred to the channel region of the selected memory cell MC from the bit line BL, it is possible to perform the set operation.

The reset (erase) can be collectively performed to all the memory cells MC constituting the NAND string, when, for instance, minus erase potential (for instance, −3.5V) is supplied to all the control gate electrodes 45, and the ground potential (0V) is supplied to the P-type well region 41c and the P-type semiconductor layer 47.

At the time of the read, the plus read potential (for instance, 0.5V) is supplied to the control gate electrode 45 of the selected memory cell MC, and the transfer potential (for instance, 1V) by which the memory cell MC becomes inevitably ON regardless of the data "0", "1" is supplied to the control gate electrode 45 of the non selected memory cell MC.

It is assumed that the threshold voltage Vth "1" of the memory cell MC of "1" state should fall in the range of 0V<Vth "1"<0.5V, and the threshold voltage Vth "0" of the memory cell MC of "0" state should fall in the range of 0.5V<Vth "0"<1V.

Further, the read current is supplied to the NAND string while making the two select gate transistors ST ON.

When such state is realized, since current quantity flowing through the NAND string is changed in accordance with the data value stored in the selected memory cell MC, it is possible to read the data by detecting this change.

Meanwhile, in this modified example, it is desirable that the hole dope amount of the P-type semiconductor layer 47 is more than that of the P-type well region 41c, and the Fermi level of the P-type semiconductor layer 47 is deeper than that of the P-type well region 41c by about 0.5V.

This is because when a plus potential is supplied to the control gate electrode 45, an inversion from P-type to N-type commences from a surface part of the P-type well region 41c between the N-type diffusion layers 42, so that the channel is to be formed.

Accordingly, for instance, at the time of the write, the channel of the non selected memory cell MC is formed only at an interface between the P-type well region 41c and the P-type semiconductor layer 47, and at the time of the read, the channel of memory cells MC inside the NAND string is formed only at an interface between the P-type well region 41c and the P-type semiconductor layer 47.

That is, even though the recording layer 44 of the memory cell MC is in the conductor (set state), the diffusion layer 42 and the control gate electrode 45 do not short-circuit.

(4) NOR Type Flash Memory

Figure 21:
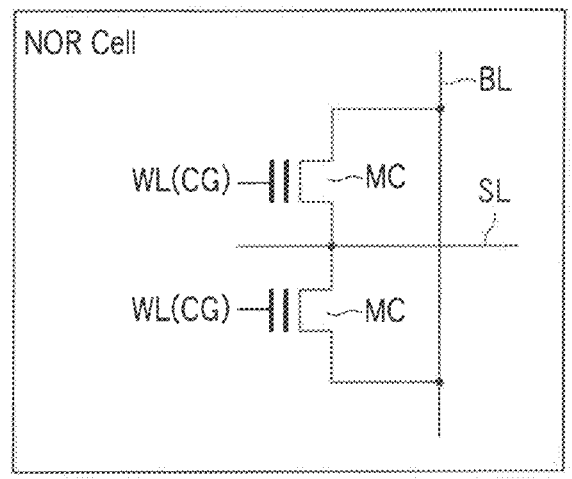
FIGS. 21 and 22 are views, each showing a NOR cell.
Figure 22:
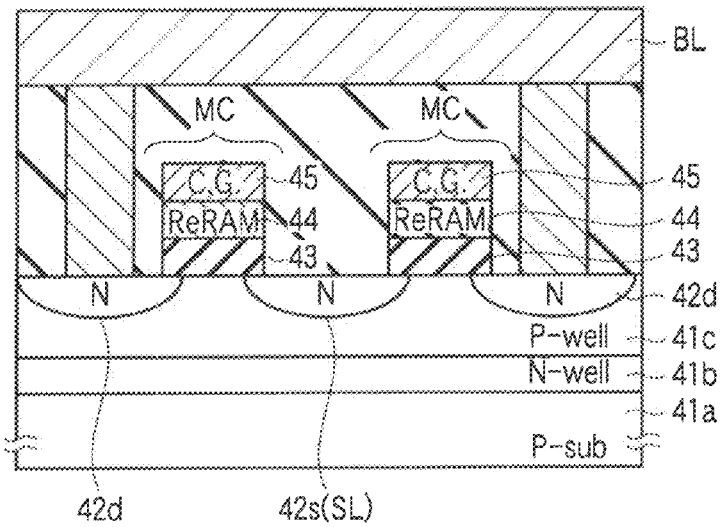

FIG. 21 shows a circuit diagram of a NOR cell unit. FIG. 22 shows a structure of the NOR cell unit according to an example of the present invention.

An N-type well region 41b and a P-type well region 41c are formed inside a P-type semiconductor substrate 41a. The NOR cell according to the example of the present invention is formed inside the P-type well region 41c.

The NOR cell is comprised one memory cell (MIS transistor) MC connected between the bit line BL and the source line SL.

The memory cell MC is comprised an N-type diffusion layer 42, a gate insulating layer 43 on the channel region between the N-type diffusion layers 42, a recording layer (ReRAM) 44 on the gate insulating layer 43, and a control gate electrode 45 on the recording layer 44.

The state (insulator/conductor) of the recording layer 44 of the memory cell MC can be changed by the above-described fundamental operation.

(5) 2-Transistor Type Flash Memory

Figure 23:
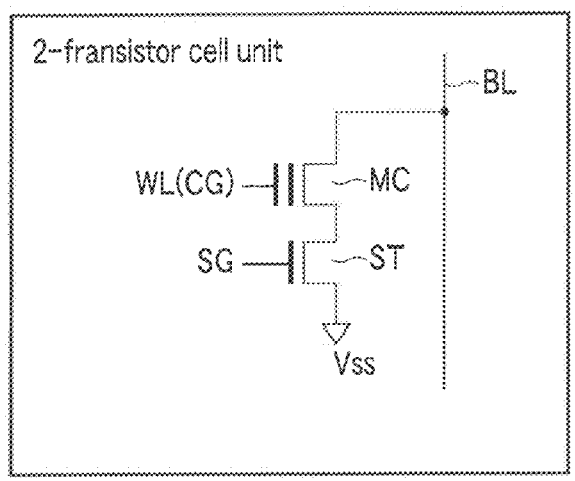
FIGS. 23 to 25 are views, each showing a 2-transistor cell unit.
Figure 24:
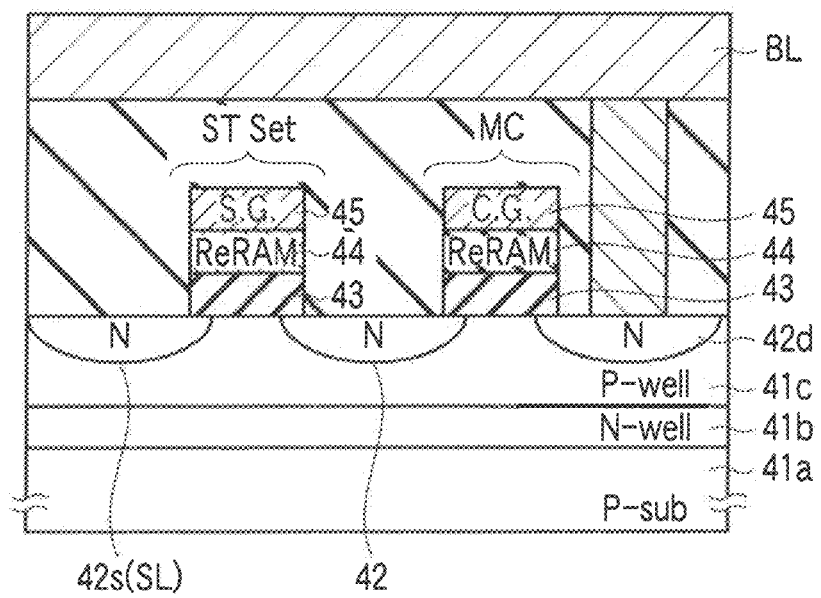

FIG. 23 shows a circuit diagram of a 2-transistor cell unit. FIG. 24 shows a structure of the 2-transistor cell unit according to the example.

The 2-transistor cell unit has been developed recently as a new cell structure having characteristic of the NAND cell unit in conjunction with characteristic of the NOR cell.

An N-type well region 41b and a P-type well region 41c are formed inside a P-type semiconductor substrate 41a. The 2-transistor cell unit according to the example of the present invention is formed inside the P-type well region 41c.

The 2-transistor cell unit is comprised one memory cell MC and one select gate transistor ST connected in series.

The memory cell MC and the select gate transistor ST have the same structure. Specifically, these are comprised an N-type diffusion layer 42, a gate insulating layer 43 on the channel region between the N-type diffusion layers 42, a recording layer (ReRAM) 44 on the gate insulating layer 43, and a control gate electrode 45 on the recording layer 44.

The state (insulator/conductor) of the recording layer 44 of the memory cell MC can be changed by the above-described fundamental operation. On the other hand, the recording layer 44 of the select gate transistor ST is fixed to the set state, that is, the conductor (resistance is small).

The select gate transistor ST is connected to the source line SL, and the memory cell MC is connected to the bit line BL.

States (insulator/conductor) of the recording layer 44 of the memory cell MC can be changed by the above-described fundamental operation.

Figure 25:
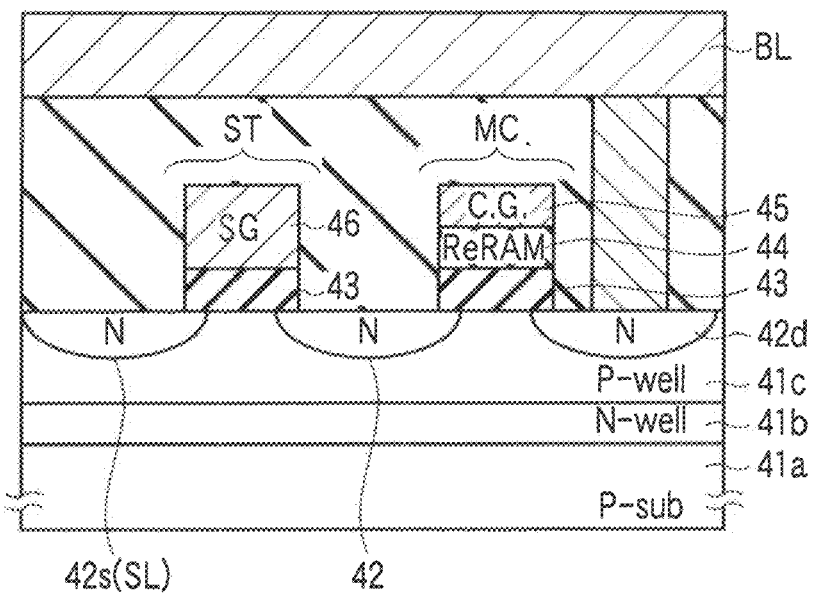

In the structure of FIG. 24, the select gate transistor ST has the same structure as the memory cell MC. However, for instance, as shown in FIG. 25, the select gate transistor ST may be a normal MIS transistor without forming the recording layer.

7. Others

According to the examples of the invention, using the conductivity change caused by the change of the valence of the transition element ion, the recording (writing) is performed only in the region (recording unit) to which the electric field is applied. Therefore, the data can be recorded in the extremely small region with the extremely small power consumption.

The erasing is performed by applying the heat. When the material proposed in the examples of the invention is used, the change in oxide structure is hardly caused. Therefore, the erasing can be performed with the small power consumption.

Alternatively the erasing can also be performed by applying the electric field opposite to that of the recording. When the material proposed in the examples of the invention is used, the erasing is performed without dissipating the thermal energy. Therefore, the erasing can be performed with the extremely small power consumption.

According to the examples of the invention, because the conductive portion is formed in the insulating material after the writing, the current is concentrated on the conductive portion in the reading. Therefore, the recording principle having the extremely high sensing efficiency can be realized.

According to the examples of the invention, the recording and the erasing can stably be repeated by the combination of the easily-transferable cation and the transition element ion which stably retains the matrix structure.

According to the examples of the invention, despite the extremely simple mechanism, the data can be recorded with recording density which cannot be realized by the conventional technology. Consequently, the examples of the invention have the large industrial merit as the next-generation technology which breaks down the wall of the recording density of the current nonvolatile memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An information recording/reproducing device comprising:
    a recording layer; and
    a recording circuit which records data to the recording layer by generating a phase change in the recording layer, wherein the recording layer includes a first chemical compound having a spinel structure, and
the recording layer is $A_xM_yX_4$ ($0.1 \leq x \leq 2.2$, $1.0 \leq y \leq 2.0$) where A includes one selected from a group of Zn, Cd and Hg, M includes one selected from a group of Ti, Zr, Hf, V, Nb and Ta, and X includes O,
wherein the C-axis of the recording layer is oriented in parallel with a film surface of the recording layer.

2. The device according to claim 1,
wherein the first chemical compound complies with $0.5 \leq x \leq 1.8$, $1.2 \leq y \leq 2.0$, $2.2 \leq x+y \leq 3.1$.

3. The device according to claim 1,
wherein the M includes one of Ti and V.

4. The device according to claim 1, further comprising a second chemical compound which is adjacent to the first chemical compound, and having a vacant site which cations in the first chemical compound can occupy.

5. The device according to claim 4, wherein the second chemical compound is one of:

where □ is a vacant site which the cations can occupy, M2 is one selected from Ti, Ge, Sn, V, Cr, Mn, Fe, Co, Ni, Nb, Ta, Mo, W, Re, Ru, and Rh, X2 is one selected from O, S, Se, N, Cl, Br, and I, and $0.3 \leq x \leq 1$;

where □ is a vacant site which the cations can occupy, M2 is one selected from Ti, Ge, Sn, V, Cr, Mn, Fe, Co, Ni, Nb, Ta, Mo, W, Re, Ru, and Rh, X2 is one selected from O, S, Se, N, Cl, Br, and I, and $1 \leq x \leq 2$;

where □ is a vacant site which the cations can occupy, M2 is one selected from Ti, Ge, Sn, V, Cr, Mn, Fe, Co, Ni, Nb, Ta, Mo, W, Re, Ru, and Rh, X2 is one selected from O, S, Se, N, Cl, Br, and I, and $1 \leq x \leq 2$;

where □ is a vacant site which the cations can occupy, M2 is one selected from Ti, Ge, Sn, V, Cr, Mn, Fe, Co, Ni, Nb, Ta, Mo, W, Re, Ru, and Rh, P is phosphorus, O is oxygen, $0.3 \leq x \leq 3$, and $4 \leq z \leq 6$; and

where □ is a vacant site which the cations can occupy, M2 is one selected from Ti, Ge, Sn, V, Cr, Mn, Fe, Co, Ni, Nb, Ta, Mo, W, Re, Ru, and Rh, O is oxygen, and $0.3 \leq x \leq 2$.

6. The device according to claim 4, wherein the second chemical compound has one of a hollandite structure, ramsdellite structure, anatase structure, brookite structure, pyrolusite structure, $ReO_3$ structure, $MoO_{1.5}PO_4$ structure, $TiO_{0.5}PO_4$ structure, $FePO_4$ structure, $\beta MnO_2$ structure, $\gamma MnO_2$ structure, and $\lambda MnO_2$ structure.

7. The device according to claim 4, wherein a Fermi level of electrons of the first chemical compound is lower than a Fermi level of electrons of the second chemical compound.

8. The device according to claim 1, wherein the recording circuit includes a probe to locally apply the voltage to a recording unit of the recording layer.

9. The device according to claim 1, wherein the recording circuit includes a word line and a bit line sandwiching the recording layer.

10. The device according to claim 9, wherein the recording layer has 10 or less crystal grains in a cross section of the word line and the bit line.

11. The device according to claim 9, wherein the recording layer is a monocrystal in a cross section of the word line and the bit line.

12. The device according to claim 9, wherein the recording circuit is connected between the word line and the bit line.

13. The device according to claim 1, wherein a size of a crystal grain of the recording circuit is 3 nm or more.

14. The device according to claim 1, wherein the recording circuit includes a MIS transistor having a gate electrode and a gate insulating layer, and the recording layer is disposed between the gate electrode and the gate insulating layer.

15. The device according to claim 1, wherein the recording circuit includes two diffusion layers in a semiconductor substrate, a semiconductor layer on the semiconductor substrate between the two diffusion layers, and a gate electrode above the semiconductor layer,
wherein the recording layer is disposed between the gate electrode and the semiconductor layer.

16. The device according to claim 1, wherein the recording layer is orientated toward a (110) direction.

* * * * *